United States Patent [19]

Kimura et al.

[11] Patent Number: 5,659,535
[45] Date of Patent: Aug. 19, 1997

[54] METHOD FOR RETRIEVING DATA FROM A STORAGE DEVICE

[75] Inventors: Noboru Kimura, Torrance; Wen-Yung Yeh, Agoura Hills, both of Calif.

[73] Assignee: Discovision Associates, Irvine, Calif.

[21] Appl. No.: 474,604

[22] Filed: Jun. 7, 1995

Related U.S. Application Data

[60] Division of Ser. No. 372,205, Jan. 13, 1995, which is a continuation-in-part of Ser. No. 238,831, May 6, 1994, abandoned.

[51] Int. Cl.$^6$ .................................................. G11B 7/00
[52] U.S. Cl. .......................... 369/124; 369/126; 369/59; 369/44.25
[58] Field of Search ........................ 369/124, 126, 369/101, 106, 59, 44.25, 275.3; 235/462

[56] References Cited

U.S. PATENT DOCUMENTS

| | | |
|---|---|---|
| Re. 32,051 | 12/1985 | Ceshkovsky et al. . |
| Re. 32,431 | 6/1987 | Dakin et al. . |
| Re. 32,574 | 1/1988 | Ceshkovsky et al. . |
| Re. 32,709 | 7/1988 | Ceshkovsky et al. . |
| 3,518,442 | 6/1970 | Johnson . |
| 3,530,258 | 9/1970 | Gregg et al. . |
| 3,638,037 | 1/1972 | McMurtrie . |
| 3,772,604 | 11/1973 | Hogg et al. . |
| 4,190,860 | 2/1980 | Somers et al. . |
| 4,210,931 | 7/1980 | Bailey et al. . |
| 4,222,072 | 9/1980 | Bailey et al. . |
| 4,225,873 | 9/1980 | Winslow . |
| 4,232,201 | 11/1980 | Canino . |
| 4,232,337 | 11/1980 | Winslow et al. . |
| 4,241,455 | 12/1980 | Eibner . |
| 4,282,598 | 8/1981 | Elliott . |
| 4,358,796 | 11/1982 | Ceshkovsky et al. . |
| 4,370,679 | 1/1983 | Ceshkovsky et al. . |
| 4,371,899 | 2/1983 | Ceshkovsky et al. . |
| 4,375,091 | 2/1983 | Dakin et al. . |
| 4,406,000 | 9/1983 | Shoji et al. . |
| 4,414,655 | 11/1983 | Shoji et al. . |
| 4,439,848 | 3/1984 | Ceshkovsky et al. . |
| 4,451,913 | 5/1984 | Elliott . |
| 4,456,914 | 6/1984 | Winslow ............................. 369/106 |
| 4,467,467 | 8/1984 | Wilkinson et al. . |
| 4,488,279 | 12/1984 | Wilkinson et al. . |
| 4,499,569 | 2/1985 | Lopez De Romana . |
| 4,499,570 | 2/1985 | Immink et al. . |
| 4,536,863 | 8/1985 | Giddings . |
| 4,550,346 | 10/1985 | Hatano . |
| 4,571,716 | 2/1986 | Szerlip . |
| 4,583,210 | 4/1986 | Winslow . |
| 4,611,318 | 9/1986 | Winslow . |
| 4,638,377 | 1/1987 | Dakin . |
| 4,701,898 | 10/1987 | Giddings . |
| 4,703,368 | 10/1987 | Dakin . |
| 4,703,467 | 10/1987 | Elliott ................................. 369/44 |
| 4,706,133 | 11/1987 | Giddings . |
| 4,727,433 | 2/1988 | Dakin . |
| 4,727,532 | 2/1988 | Giddings . |
| 4,751,692 | 6/1988 | Giddings . |
| 4,757,393 | 7/1988 | Dakin et al. . |
| 4,774,699 | 9/1988 | Giddings . |
| 4,809,247 | 2/1989 | Elliott . |
| 4,811,280 | 3/1989 | Berkowitz et al. . |
| 4,845,697 | 7/1989 | Giddings . |
| 4,928,187 | 5/1990 | Rees . |
| 4,972,276 | 11/1990 | Wadaya et al. . |
| 4,998,011 | 3/1991 | Shuman . |
| 5,003,526 | 3/1991 | Bailey . |
| 5,084,852 | 1/1992 | Bailey . |
| 5,099,464 | 3/1992 | Maeda . |
| 5,101,395 | 3/1992 | Cardero et al. ....................... 369/59 |
| 5,109,373 | 4/1992 | Ohno et al. ......................... 369/100 |
| 5,136,558 | 8/1992 | Getreuer et al. . |
| 5,155,633 | 10/1992 | Grove et al. . |
| 5,159,340 | 10/1992 | Smith . |
| 5,177,640 | 1/1993 | Grassens . |
| 5,204,848 | 4/1993 | Cardero et al. . |
| 5,245,174 | 9/1993 | Prikryl et al. . |
| 5,253,244 | 10/1993 | Bailey . |
| 5,289,455 | 2/1994 | Kuroda et al. ....................... 369/126 |
| 5,303,217 | 4/1994 | Bakx et al. .......................... 369/48 |
| 5,313,332 | 5/1994 | Schell et al. . |
| 5,321,680 | 6/1994 | Bailey . |
| 5,331,622 | 7/1994 | Ernst et al. . |
| 5,349,175 | 9/1994 | Prikryl . |
| 5,373,490 | 12/1994 | Bailey . |
| 5,375,116 | 12/1994 | Bailey . |
| 5,396,479 | 3/1995 | Johann ............................... 369/59 |
| 5,400,318 | 3/1995 | Nakayama et al. .................. 369/275.3 |
| 5,448,544 | 9/1995 | Tsuchinaga et al. ................. 369/59 |
| 5,448,545 | 9/1995 | Bailey . |
| 5,479,390 | 12/1995 | Bailey . |

FOREIGN PATENT DOCUMENTS

| | | |
|---|---|---|
| 833100 | 1/1970 | Canada . |
| 51343 | 5/1982 | European Pat. Off. . |
| 466329 | 1/1992 | European Pat. Off. . |
| 60-070552 | 4/1985 | Japan . |
| 60-197908 | 10/1985 | Japan . |
| 63-069067 | 3/1988 | Japan . |
| 1628236 | 12/1991 | Japan . |
| 1670392 | 6/1992 | Japan . |

*Primary Examiner*—Loha Ben
*Attorney, Agent, or Firm*—Ronald J. Clark; Robert T. Braun; Paul M. Thyfault

[57] ABSTRACT

A method for detecting transitions in an input signal having a DC component. The method includes the steps of generating a threshold signal from the input signal, comparing the input signal to the threshold signal to thereby generate an output signal, and adjusting the threshold signal in response to the output signal. In one preferred embodiment, the method is employed to retrieve data from an information storage device.

20 Claims, 17 Drawing Sheets

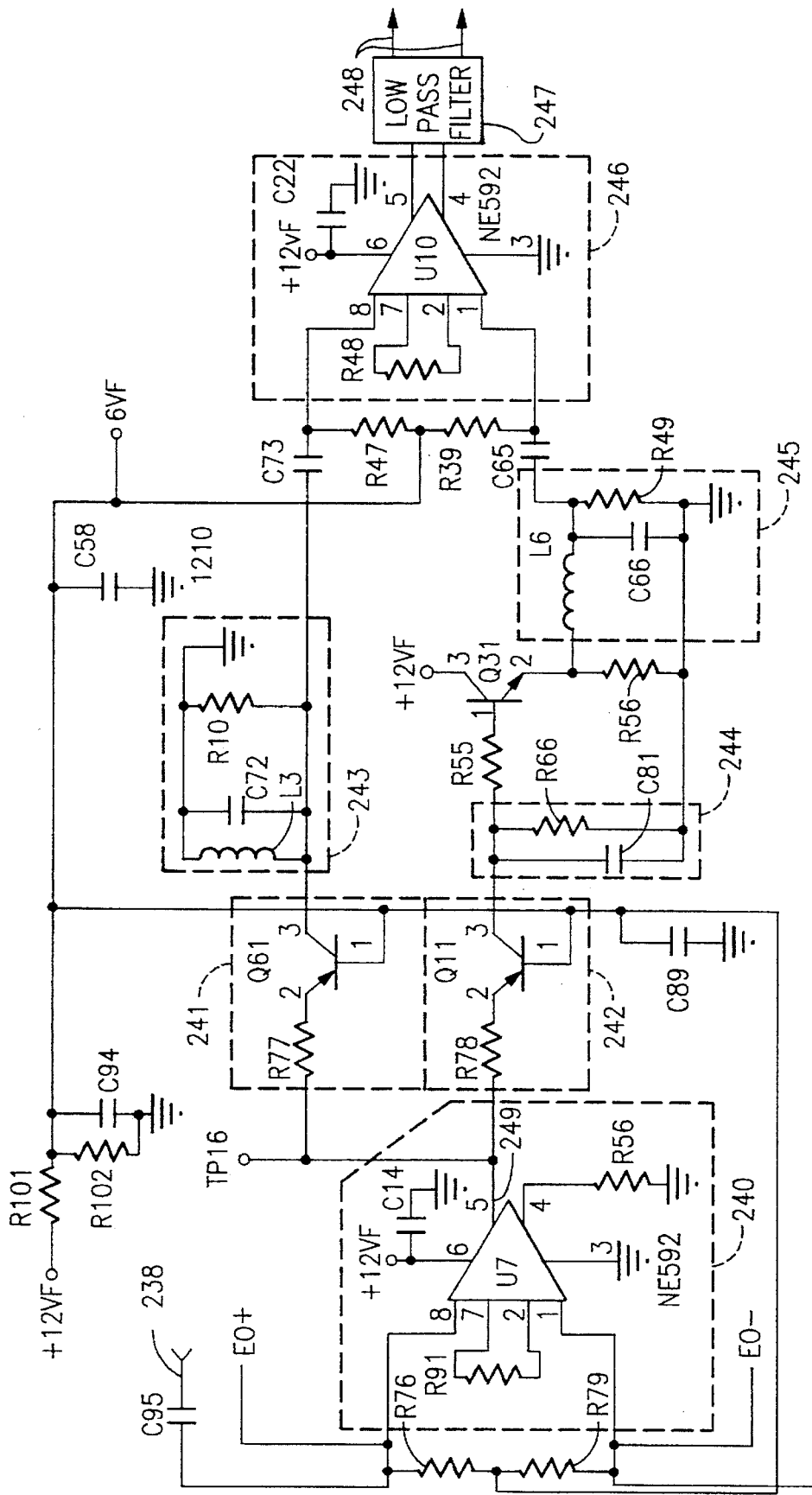

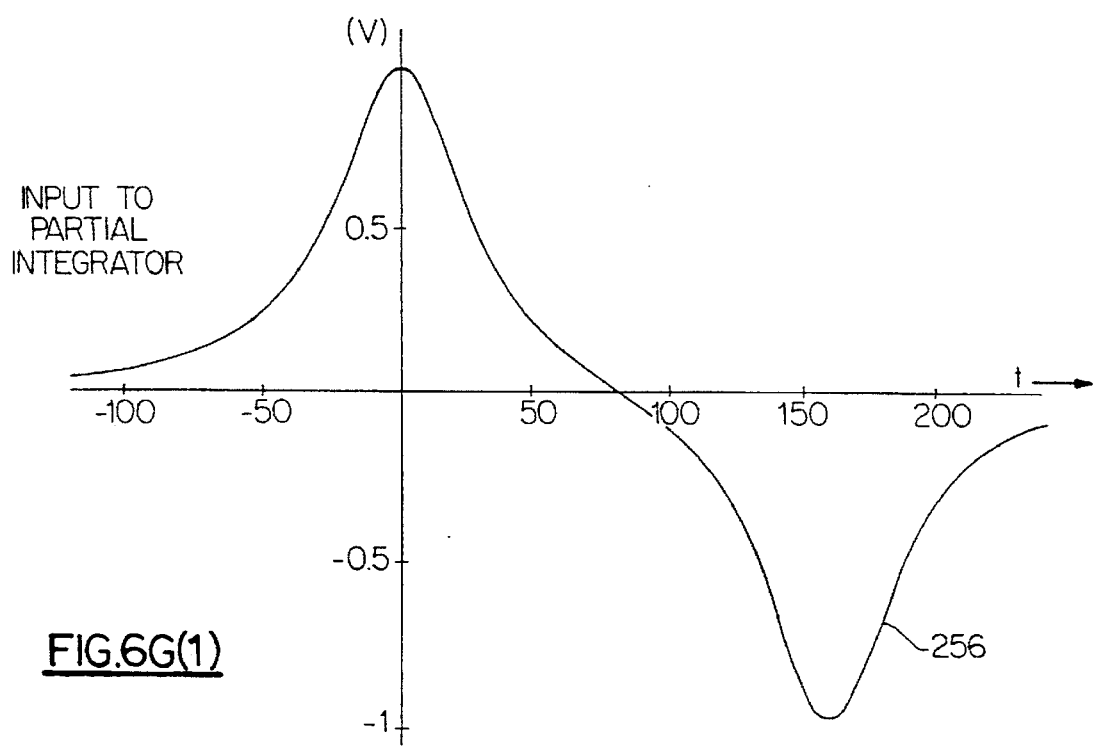
FIG.6G(1)
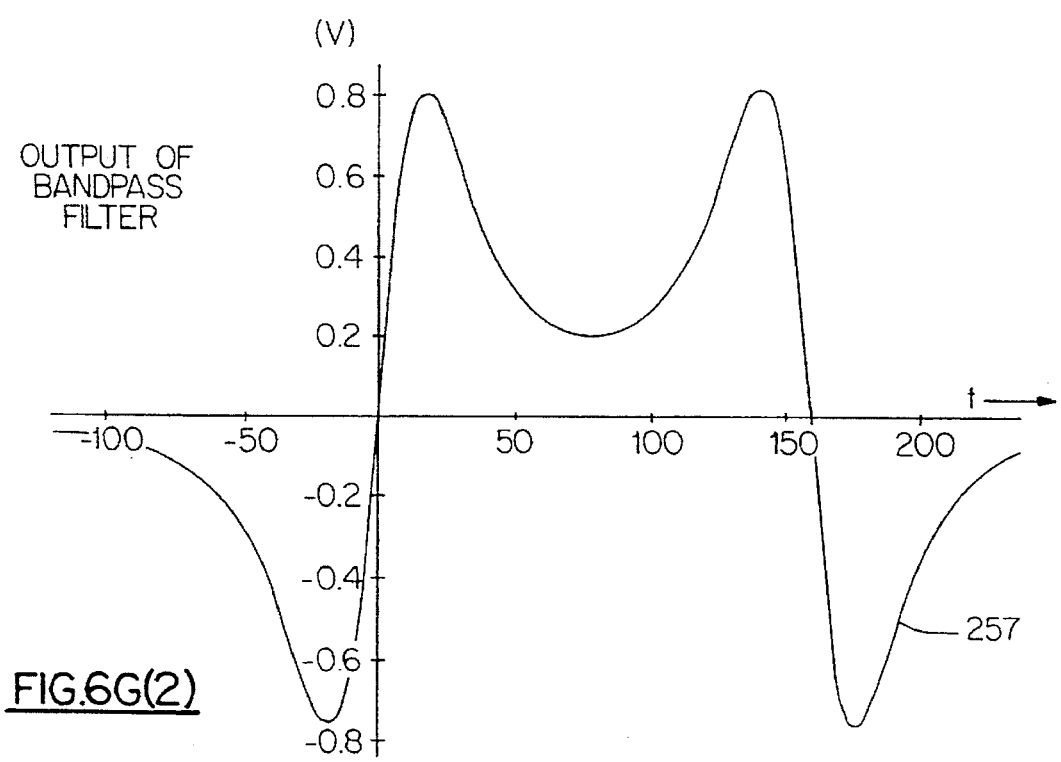
FIG.6G(2)

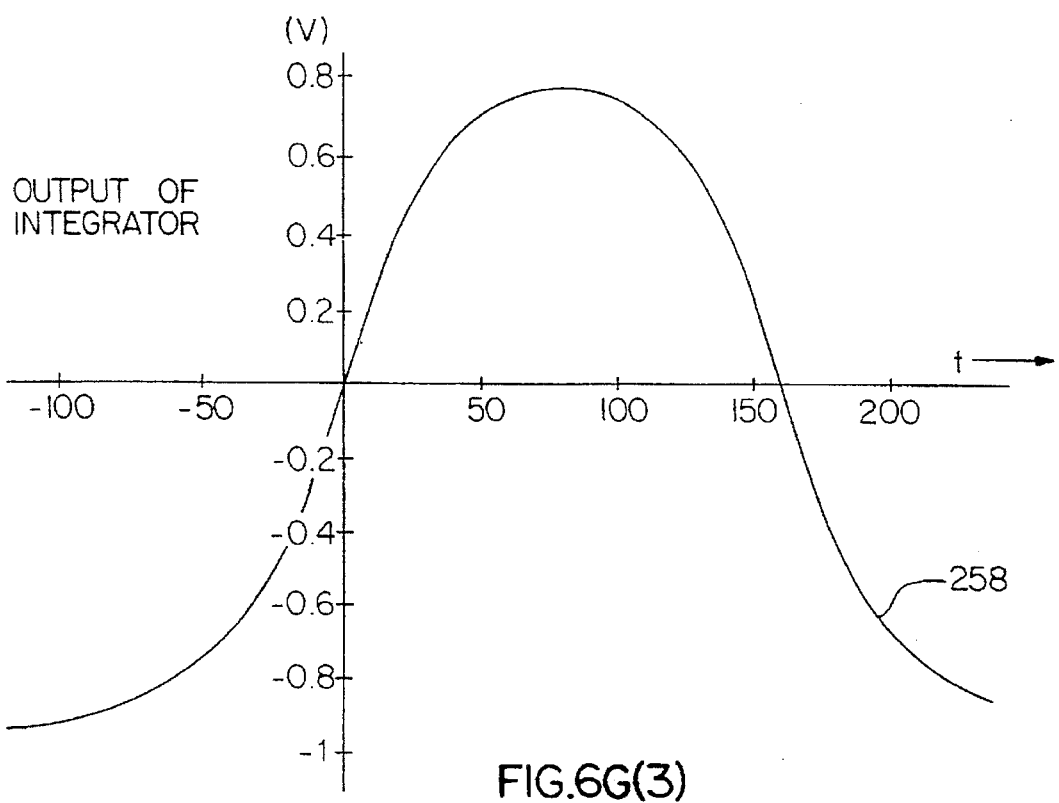
FIG.6G(3)
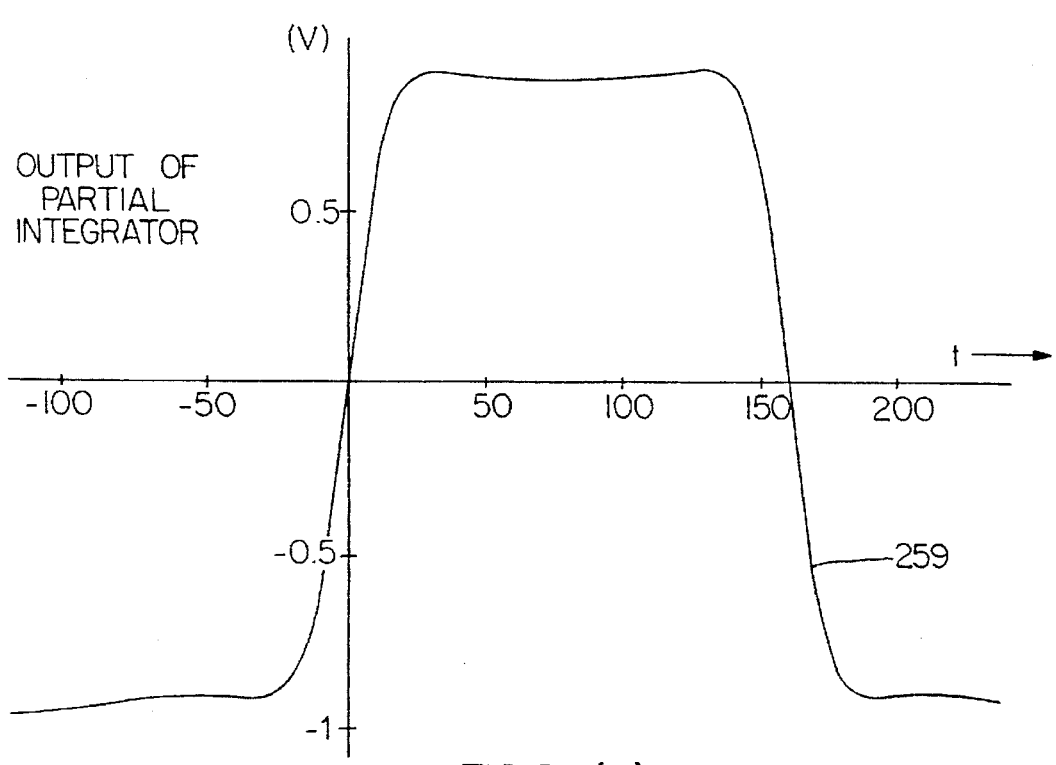
FIG.6G(4)

METHOD FOR RETRIEVING DATA FROM A STORAGE DEVICE

REFERENCE TO RELATED APPLICATIONS

This application is a divisional of U.S. patent application Ser. No. 08/372,205 filed Jan. 13, 1995 which is a continuation-in-part of U.S. patent application Ser. No. 08/238,831 filed May 6, 1994, now abandoned.

FIELD OF THE INVENTION

This invention relates to storage and retrieval of data stored on various magnetic and/or electronic media and, more particularly, to a method and apparatus for storing and retrieving data in a magneto-optical disk system.

BACKGROUND OF THE INVENTION

Various types of recordable and/or erasable media have been used for many years for data storage purposes. Such media may include, for example, magnetic tapes or disks in systems having a variety of configurations.

Magneto-optical ("MO") systems exist for recording data on and retrieving data from a magnetic disk. The process of recording in a magneto-optical system typically involves use of a magnetic field to orient the polarity of a generalized area on the disk while a laser pulse heats a localized area, thereby fixing the polarity of the localized area. The localized area with fixed polarity is commonly called a pit or mark. Some encoding systems use the existence or absence of a pit or mark on the disk to define the recorded data as a "1" or "0", respectively.

When recording data, a binary input data sequence may be converted by digital modulation to a different binary sequence having more desirable properties. A modulator may, for example, convert m data bits to a code word with n modulation code bits (or "binits"). In most cases, there are more code bits than data bits—i.e., m<n.

Most if not all disk drive systems use run-length-limited ("RLL") modulation codes, such as RLL 2/7/1/2 or RLL 1/7/2/3 codes. Another family of modulation codes are group-coded recording ("GCR") codes, such as GCR 0/11/8/9 or GCR 0/3/8/9 codes (sometimes abbreviated as GCR 8/9). The numbers appended to the names of particular codes typically refer to certain encoding constraints, such the relationship between bits and flux reversals, or the minimum and maximum number of contiguous binits possible without flux transitions. For example, a commonly used encoding system for pit-type recording is the RLL 2/7/1/2 code which constrains the recorded information to have a minimum of two and a maximum of seven zeroes between ones. In general, RLL recording provides a relatively high data-to-pit ratio but may not, however, in many circumstances allow for high data storage densities because amplitude and timing margins deteriorate very rapidly as frequency is increased.

A GCR 0/3/8/9 code, on the other hand, not only requires nine flux reversals for every eight data bits but further requires a minimum of no zeroes and a maximum of three zeroes between ones.

The density ratio of a given recording system is often expressed according to the equation $(m/n) \times (d+1)$, where m and n have the definitions provided above, and d is defined as the minimum number of zeroes occurring between ones. Thus, the RLL 2/7/1/2 code has, according to the above equation, a density ratio of 1.5, while the GCR 0/3/8/9 code has a density ratio of 0.89.

For reading data in an MO system, a focused laser beam or other optical device is typically directed at the recording surface of a rotating optical disk such that the laser beam can selectively access one of a plurality of tracks on the recorded surface. The rotation of the laser beam reflected from the recorded surface may be detected by means of Kerr rotation. A change in Kerr rotation of a first type, for example, represents a first binary value. A change in Kerr rotation of a second type represents a second binary value. An output signal is generated from the first and second binary values occurring at specified clock intervals.

Although there has been a continual demand for disk systems capable of storing increasingly higher data densities, the ability to achieve high data storage densities has met with several limitations. As a general matter, the reasonable upper limit for data density is determined in part by reliability requirements, the optical wavelength of the laser diode, the quality of the optical module, hardware cost, and operating speed. Maximum data densities are also affected by the ability to reject various forms of noise, interference, and distortion. For example, the denser that data is packed, the more intersymbol interference will prevent accurate recovery of data. Moreover, because the technology for many intermediate and high performance optical disk drives has been limited by downward compatibility constraints to older models, signal processing techniques have not advanced as rapidly as they might have otherwise.

When attempting to recover stored data, existing read channels of magneto-optical and other types of disk drives commonly suffer from a number of problems due to the unintended buildup of DC components in the read signal. One cause of DC buildup results from the recording of asymmetric data patterns over a number of bytes or data segments. A symmetric data pattern may be considered as one having an average DC component of zero over a region of interest. Because sequences of recorded bits may be essentially random in many modulation codes, however, localized regions of recorded data having particular patterns of 1's and 0's will produce an unsymmetric read signal having unwanted DC components. Because the data patterns vary over time, the level of DC buildup will also vary, causing wander of the DC baseline, reduction of threshold detection margins, and greater susceptibility to noise and other interference.

Undesired DC buildup is also caused by variance in pit size due to thermal effects on the writing laser or the storage medium. As the writing laser heats up, for example, the spot size may increase leading to wider pits or marks. When the recorded pits are read, variations in pit size will cause an unsymmetric input signal having DC components. Variation in pit size not only causes undesired DC buildup but also causes the relative locations of the data to appear shifted in time, reducing the timing margin and leading to possible reading errors.

Various attempts have been made to overcome the described problems. For example, various tape drive systems commonly use a DC-free code such as a 0/3/8/10 code, otherwise referred to simply as an 8/10 code. Because an 8/10 code requires 10 stored bits to yield 8 data bits, however, it is only 80% efficient which is a drawback when attempting to record high data densities.

Another method for handling DC buildup involves the use of double differentiation. This method typically involves detection of the peaks of a first derivative of the input signal by detecting zero-crossings of the second derivative of the input signal. Thus, the DC components are effectively filtered out. One drawback of this method is that differentiation or double differentiation can cause undesirable noise effects. A second drawback is that the method may decrease the timing margin to unacceptably low levels (e.g., by as much as 50 percent).

In another method for addressing DC buildup, the data to be stored is randomized prior to recording such that none of the data patterns repeat over a data sector. However, this method may not be acceptable by ISO standards and may lack downward compatibility with previous disk drive systems. As a further drawback to this method, de-randomizing the data may be complex.

Yet another method for controlling DC buildup involves the use of so-called resync bytes between data segments. This method generally involves the examination and manipulation of data before it is recorded in order to minimize DC buildup upon readback. Before recording, two consecutive data segments are examined to determine if the patterns of 1's and 0's are such as to cause positive DC, negative DC, or no DC components when read back. If, for example, two consecutive data segments have the same DC polarity, one of the data segments is inverted prior to being recorded on the medium. In order to stay within the constraints of the particular encoding system, however, a resync byte between the segments may need to be written so that the pattern of contiguous bits and flux reversals is proper. A drawback of such a method is that it will not necessarily reduce all DC buildup, and time constants must be determined such that the predictable DC buildup will not affect performance. Further, the method requires additional overhead including the examination of data segments to determine their relative polarity.

It would therefore be advantageous to have a method and device for reading stored data from a medium without suffering the undesirable effects of DC buildup, without creating unacceptable levels of noise or significantly reducing timing margins, without the requirement of large amounts of overhead or de-randomizing algorithms, while providing high data storage efficiency.

SUMMARY OF THE INVENTION

An apparatus and method is provided for retrieving densely stored data from various types of magnetic media. One embodiment of the invention generally comprises the steps of differentiation, equalization, partial integration, and data generation. The steps of differentiation, equalization and partial integration may generally provide a preprocessed signal corresponding to a playback signal but with better resolution and reduced noise. Data generation may further comprise the steps of detecting the positive and negative peaks of the preprocessed signal in a manner so as to account for the DC component, and generating a threshold corresponding to the midpoint of the measured positive and negative peak values. The method further may involve the step of feeding back a signal indicative of variations in the duty cycle of the output signal so as to enable tracking of the DC component by positive and negative peak detection circuits.

BRIEF DESCRIPTION OF THE DRAWINGS

FIG. 5B is a detailed circuit diagram of a partial integrator stage;

FIG. 6G is a waveform diagram showing signal waveforms at various stages in the read channel;

DETAILED DESCRIPTION OF THE SPECIFIC EMBODIMENTS

Although the present invention is applicable to many different data storage and retrieval systems, the following description of the preferred embodiment will focus primarily on magneto-optical systems. In so doing, there is no intent to limit the scope of the invention solely to devices which are magneto-optical in nature.

A detailed system for storing and retrieving data from a magneto-optical device is provide in related application Ser. No. 07/964,518 filed Jan. 25, 1993, now U.S. Pat. No. 5,537,379 which application is incorporated by reference as if fully set forth herein.

Figure 1:
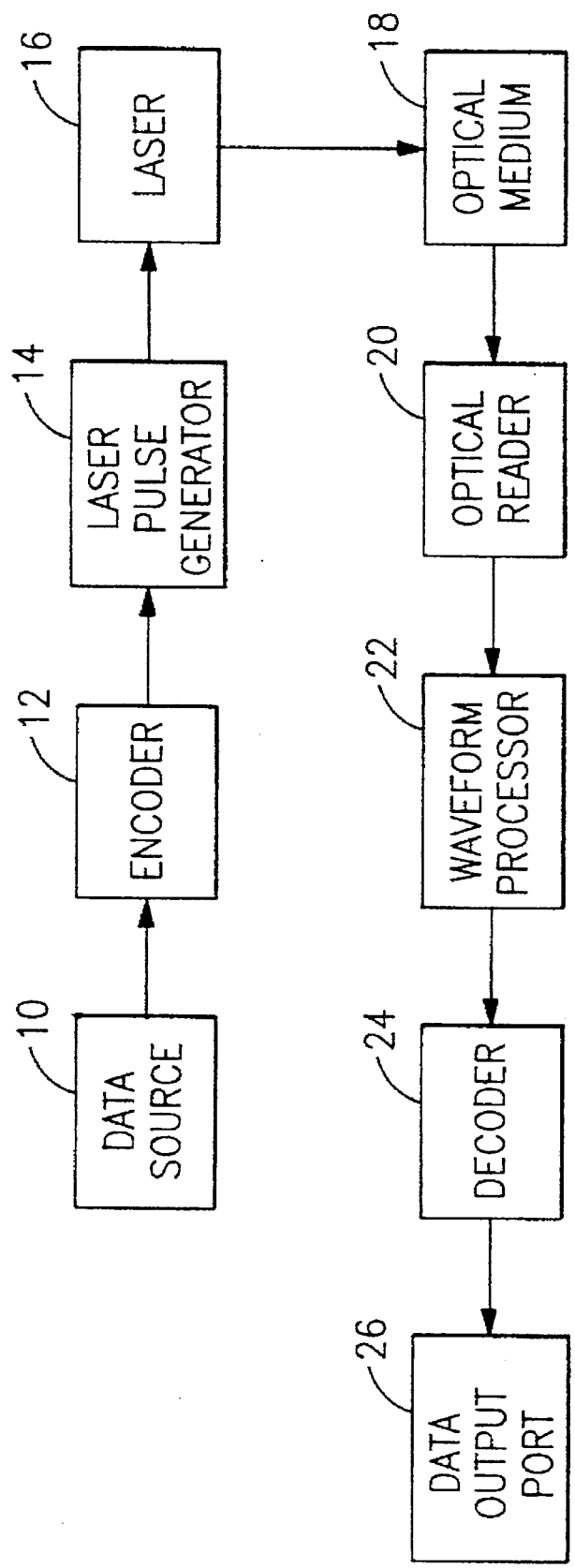
FIG. 1 is a block diagram showing an optical data storage and retrieval system.

A block diagram of an exemplary magneto-optical system is shown in FIG. 1. The system may have a read mode and a write mode. During the write mode, a data source 10 transmits data to an encoder 12. The encoder 12 converts the data into binary code bits. The binary code bits are transmitted to a laser pulse generator 14, where the code bits may be converted to energizing pulses for turning a laser 16 on and off. In one embodiment, for example, a code bit of "1" indicates that the laser will be pulsed on for a fixed duration independent of the code bit pattern, while a code bit of "0" indicates that the laser will not be pulsed at that interval. Depending on the particular laser and type of optical medium being used, performance may be enhanced by adjusting the relative occurrence of the laser pulse or extending the otherwise uniform pulse duration. In response to being pulsed, the laser 16 heats localized areas of an optical medium 18, thereby exposing the localized areas of the optical medium 18 to a magnetic flux that fixes the polarity of the magnetic material on the optical medium 18. The localized areas, commonly called "pits", or marks store the encoded data in magnetic form until erased.

During the read mode, a laser beam or other light source is reflected off the surface of the optical medium 18. The reflected laser beam has a polarization dependent upon the polarity of the magnetic surface of the optical medium 18. The reflected laser beam is provided to an optical reader 20, which sends an input signal or read signal to a waveform processor 22 for conditioning the input signal and recovering the encoded data. The output of the waveform processor 22 may be provided to a decoder 24. The decoder 24 translates the encoded data back to its original form and sends the decoded data to a data output port 26 for transmission or other processing as desired.

Figure 2:
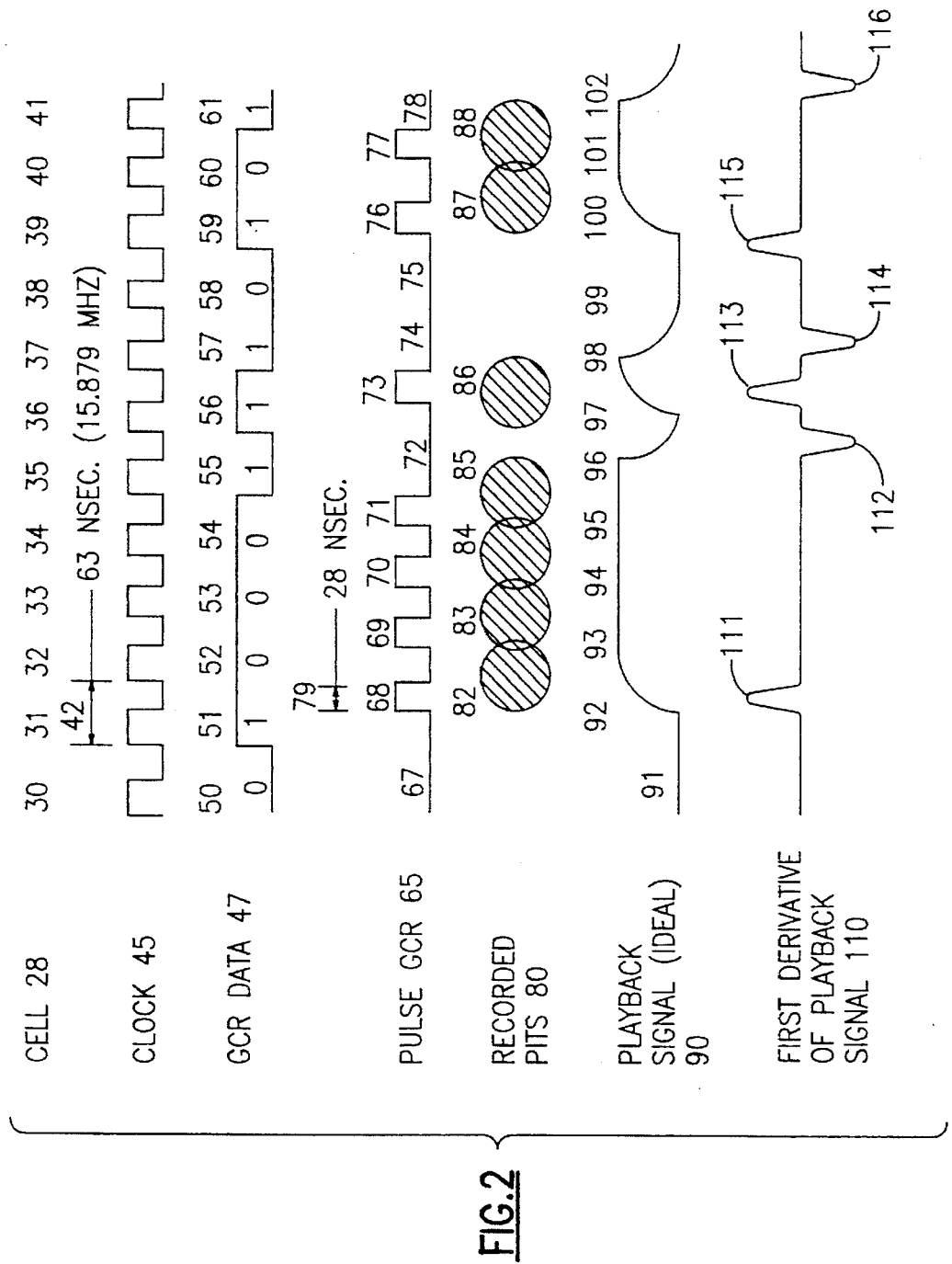
FIG. 2 is a series of sample waveforms associated with a GCR format.

FIG. 2 depicts in more detail the process of data storage and retrieval using a GCR 8/9 code format. For a GCR 8/9 code, a cell 28 is defined as one channel bit. Each clock period 42 corresponds to a channel bit; thus, cells 30 through 41 each correspond to one clock period 42 of clock waveform 45. As an example of clock speeds, for a 3½" optical disk rotating at 2,400 revolutions per minute with a storage capacity of 256 Mbytes, clock period 42 will typically be 63 nanoseconds or a clock frequency of 15.879 Mhz. GCR input waveform 47 is the encoded data output from the encoder 12 (see FIG. 1). The GCR input waveform 47 corresponds to a representative channel sequence "010001110101". The laser pulse generator 14 uses the GCR data waveform 47 to derive a pulse GCR waveform 65 (which in FIG. 2 has not been adjusted in time or duration to reflect performance enhancement for specific data patterns). Generally, the GCR pulses 67 through 78 occur at clock periods when the GCR data waveform 47 is high. The pulse GCR waveform 65 is provided to the laser 16. The magnetization of the optical medium reverses polarity as the laser is pulsed on and off (e.g., by utilizing a non-return-to-zero ("NRZ") driving signal to energize a magnetic recording head). The laser pulses resulting from GCR pulses 68, 69, 70, etc., create a pattern of recorded pits or marks 80 on optical medium 18. Thus, recorded pits 82 through 88 correspond to pulses 68, 69, 70, 71, 73, 76, and 77, respectively.

Successive recorded pits 82 through 85 may merge together to effectively create an elongated pit. The elongated pit has a leading edge corresponding to the leading edge of the first recorded pit 82 and a trailing edge corresponding to the trailing edge of last recorded pit 85.

Reading the recorded pits with an optical device such as a laser results in the generation of a playback signal 90. The playback signal 90 is low in the absence of any recorded pits. At the leading edge of a pit 86, playback signal 90 will rise and remain high until the trailing edge of the pit 86 is reached, at which point the playback signal 90 will decay and remain low until the next pit 87.

The above described process may be referred to as pulse width modulation ("PWM") because the width of the pulses in playback signal 90 indicate the distance between 1-bits. Thus, the edges of the recorded pits 80 which define the length of the pulses in playback signal 90 contain the pertinent data information. If the playback signal is differentiated, the signal peaks 111 through 116 of the first derivative signal 110 will correspond to the edges of the recorded pits 80. (The signal peaks of the first derivative playback signal 110 in FIG. 2 are shown slightly offset from the edges of the recorded pits 80 because an ideal playback signal 90 is shown). In order to recover the pit edge information from the first derivative signal 110, it is necessary to detect the signal peaks 111 through 116. Such a process is described in detail further herein.

In contrast, most if not all existing RLL 2/7 code systems are used in conjunction with pulse position modulation ("PPM"). In PPM systems, each pit represents a "1" while the absence of a pit represents a "0". The distance between pits represents the distance between 1-bits. The center of each pit corresponds to the location of the data. In order to find the pit centers, the playback signal is differentiated and the zero-crossings of the first derivative are detected. Such a technique may be contrasted with PWM systems, described above, in which the signal peaks of the first derivative contain the pertinent pulse width information.

It is nevertheless possible to utilize PWM instead of PPM with an RLL system such as an RLL 2/7 code system. Each channel bit may correspond to a clock period of a clock waveform. As with the GCR system described earlier using PWM, a "1" may be represented by a transition in the input waveform. Thus, the RLL 2/7 input waveform may remain in the same state while a "0" occurs, but changes from high-to-low or low-to-high when a "1" occurs.

In both RLL and GCR codes, as well as other codes, when data patterns are read, the input signal generated from the optical reader 20 is often not symmetric. When an asymmetric signal is AC-coupled between circuits, the average DC value shifts away from the peak-to-peak midpoint. The unintended shifting away from the midpoint may result in a shift in the apparent position of the data, adversely affect the ability to determine accurately the locations of data, and reduce timing margins or render the recorded data unrecoverable.

Figure 3A:
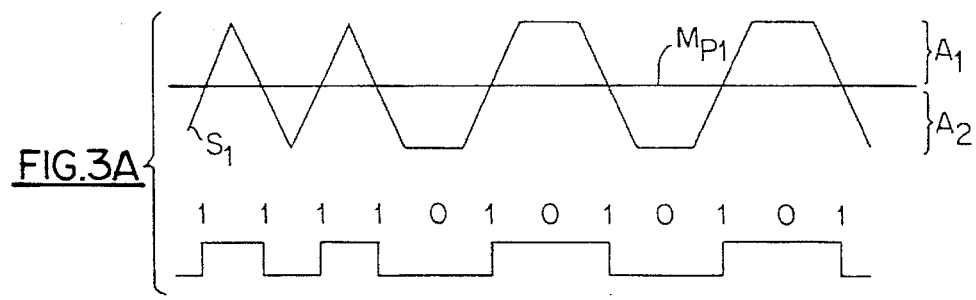
FIGS. 3A and 3B are waveform diagrams of asymmetric and asymmetric input signal, respectively.

This phenomenon may be explained with reference to FIGS. 3A and 3B. FIG. 3A shows an ideal input signal $S_1$ derived from a symmetric data pattern. Normally, transitions between 1's and 0's in the data are detected at the midpoint between high and low peaks of the input signal. It may be observed in FIG. 3A that the areas $A_1$ and $A_2$ above and below the peak-to-peak midpoint $M_1$ of the input signal $S_1$ are equal, and the transitions between 1's and 0's correspond precisely (in an ideal system) to the crossings of the input signal $S_1$ and the peak-to-peak midpoint $M_{P1}$.

Figure 3B:
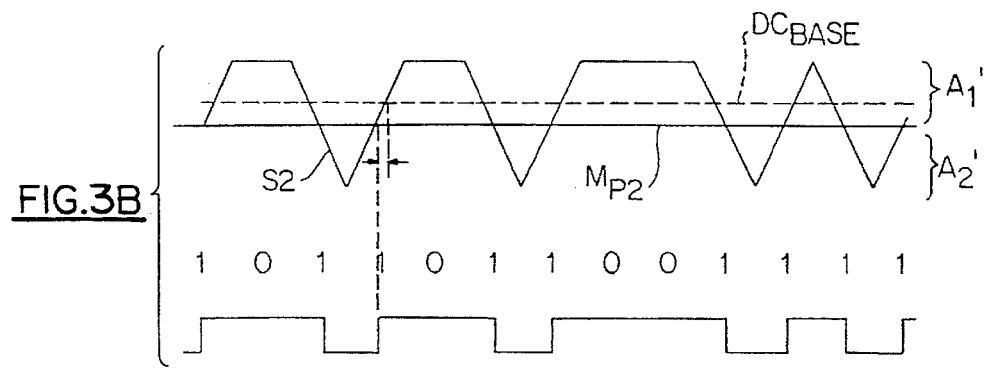

FIG. 3B, in contrast, shows an input signal $S_2$ derived from an asymmetric data pattern. It may be observed that the area $A_1'$ above the peak-to-peak midpoint $M_{P2}$ is greater than the are $A_2'$ below the graph. The input signal $S_2$ therefore has a DC component that shifts the DC baseline $DC_{BASE}$ above the peak-to-peak midpoint $M_{P2}$. When an attempt is made to locate transitions between 1's and 0's by determining the zero-crossings of the input signal $S_2$, errors may be made because the DC level is not identical to the peak-to-peak midpoint $M_{P2}$. The DC level does not stay constant but rises and falls depending on the nature of the input signal. The larger the DC buildup, the more the detected transitions will stray from the true transition points. Thus, DC buildup can cause timing margins to shrink or the data to be unrecoverable.

Figure 4:
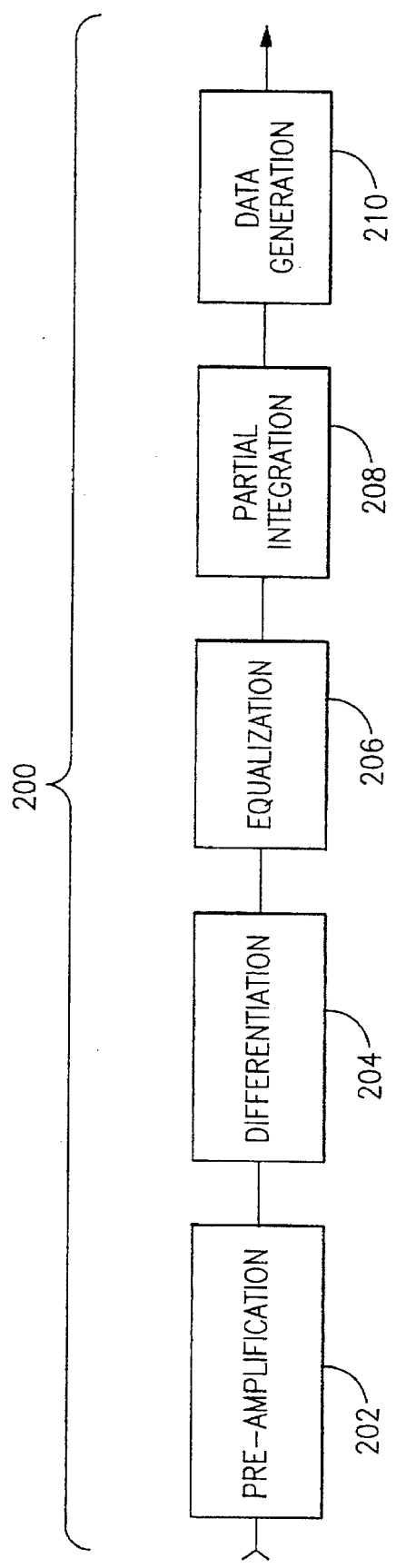
FIG. 4 is a block diagram of a read channel.

FIG. 4 is a block diagram of a read channel 200 in accordance with one embodiment of the present invention for mitigating the effects of DC buildup. The read channel 200 roughly corresponds to the waveform processor 22 of FIG. 1. The read channel 200 includes a preamplification stage 202, a differentiation stage 204, an equalization stage 206, a partial integration stage 208, and a data generation stage 210. The operation of the read channel 200 will be explained with reference to a more detailed block diagram shown in FIG. 5, the waveform diagrams shown in FIGS. 10A–10D, and various other figures as will be referenced from time to time herein.

Figure 10A:
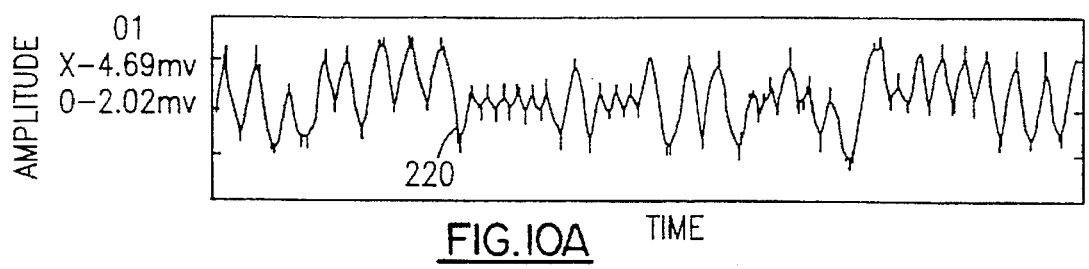
FIGS. 10A–10D are diagrams showing exemplary waveforms at various points in a read channel.

When the optical medium is scanned for data, the preamplification stage 202 amplifies the input signal to an appropriate level. The pre-amplification stage 202 may include a pre-amplifier 203 as is well known in the art. The pre-amplifier 203 may alternatively be located elsewhere such as within the optical reader 20. An exemplary amplified playback signal 220 is depicted in FIG. 10A.

Figure 5:
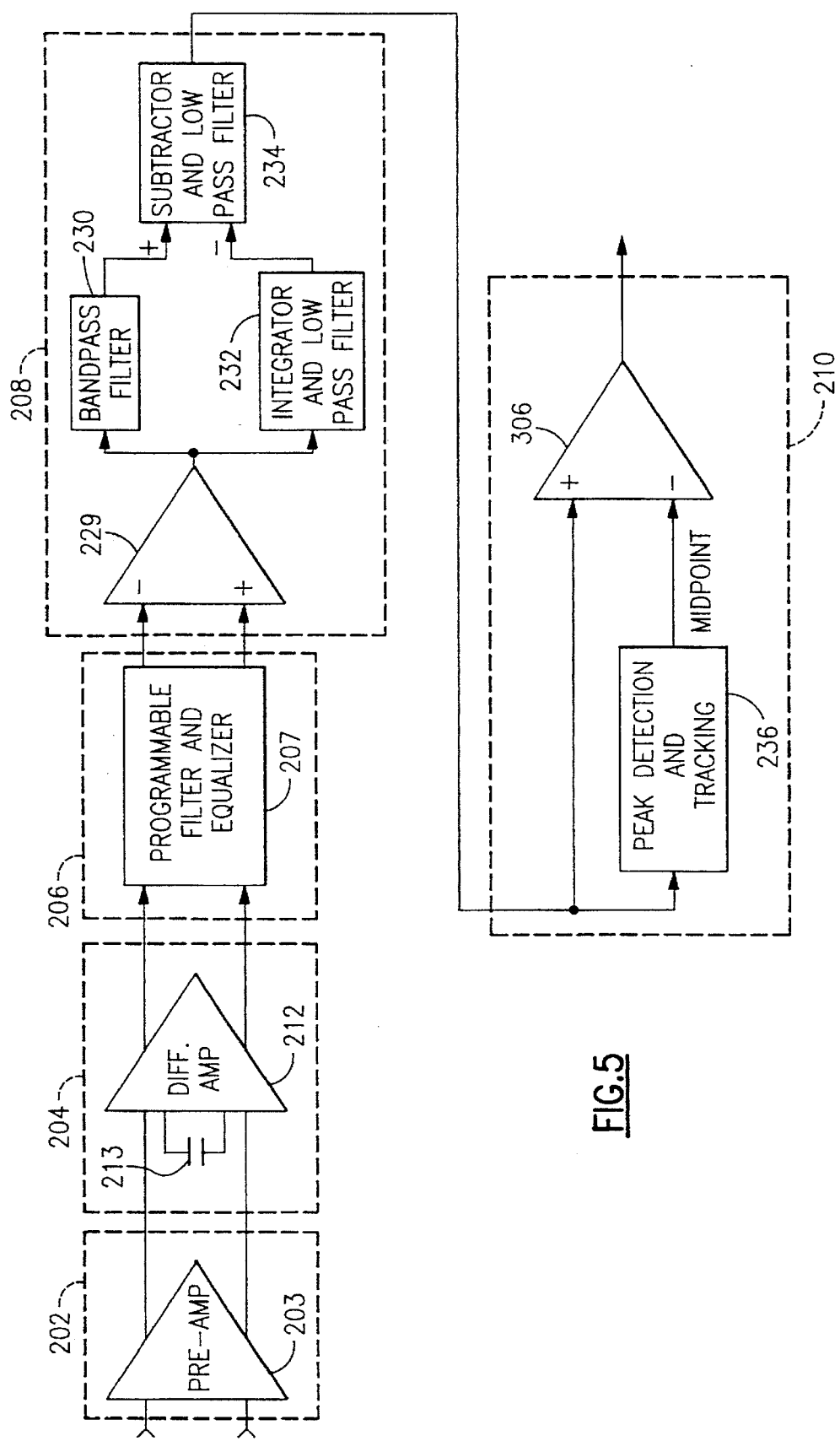
FIG. 5 is a more detailed block diagram of various stages of a read channel.
Figure 6A:
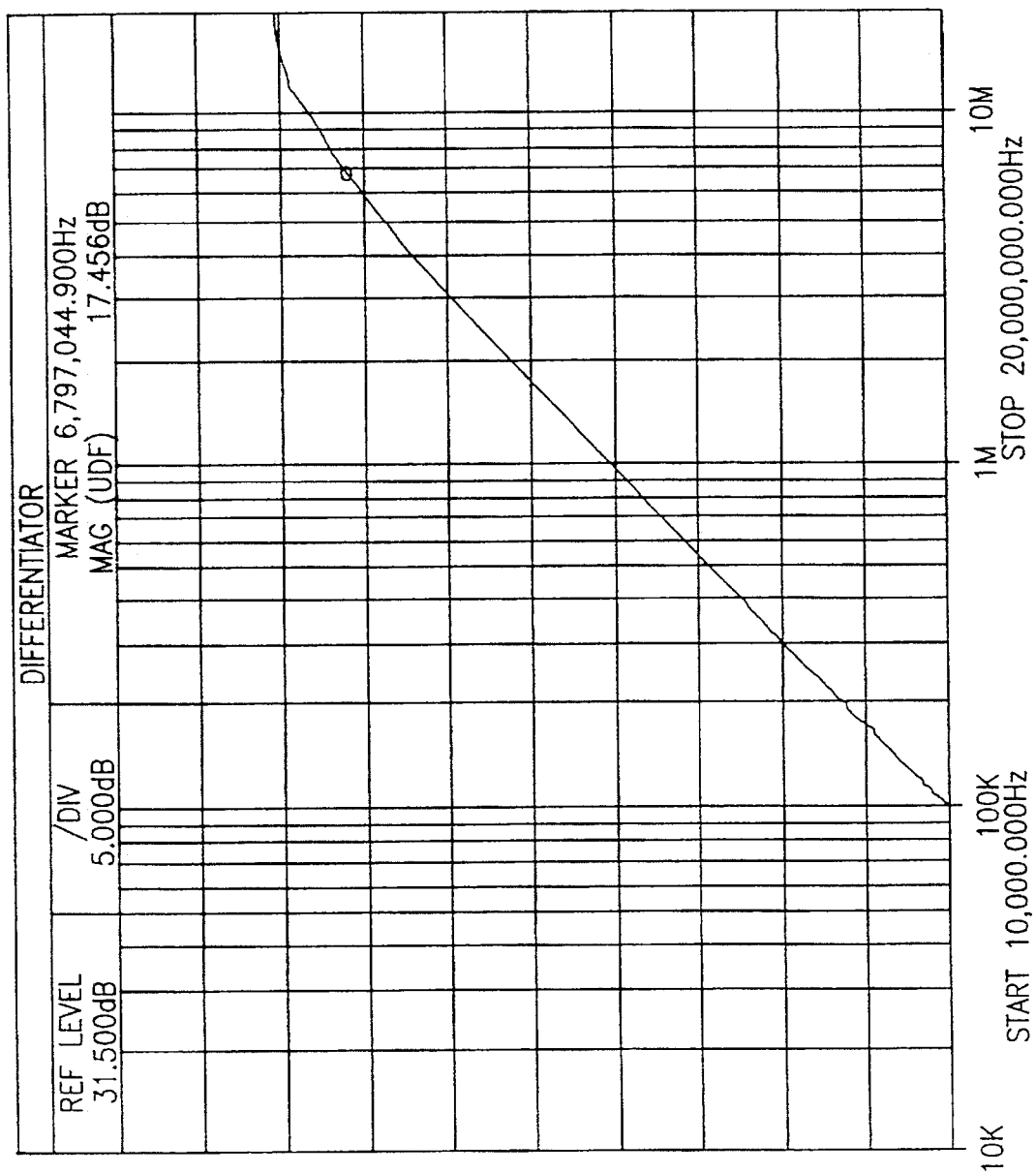
FIGS. 6A–6E are frequency response diagrams of various stages of a read channel.
Figure 10B:
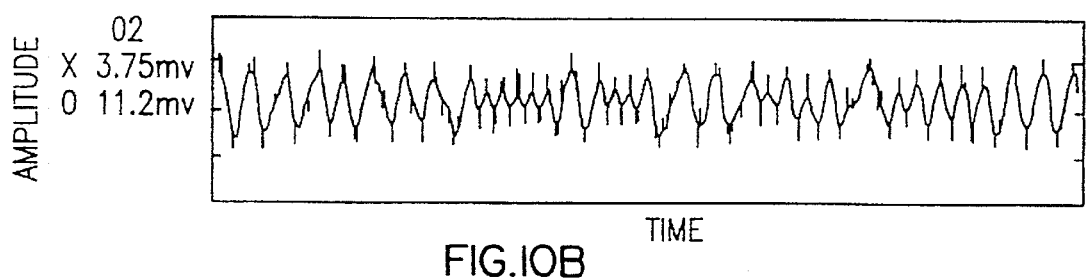

The output of the preamplification stage 202, as shown in FIG. 5, is provided to the differentiation stage 204. The differentiation stage 204 may include a differential amplifier 212 such as a video differential amplifier configured with a capacitor 213 in a manner well known in the art. A representative frequency response diagram of the differentiation stage 204 is shown in FIG. 6A. The differentiation stage 204 effectively increases the relative magnitudes of the high frequency components of the amplified playback signal 220. An exemplary waveform of the output of the differentiation stage 204 is shown in FIG. 10B.

The differentiation stage 204 is followed by the equalization stage 206 as shown in FIG. 5. The equalization stage 206 provides additional filtering so as to modify the overall channel transfer function and provide more reliable data detection. The equalization stage 206 shapes the differentiated input signal so as to even out the amplitudes of high and low frequency components and generate a smoother signal for later processing. Equalizing filters often modify the noise spectrum as well as the signal. Thus, an improvement in the shape of the differentiated input signal (i.e., a reduction in distortion) is usually accompanied by a degradation in the signal-to-noise ratio. Consequently, design of the equalization stage 206 involves a compromise between attempting to minimize noise and providing a distortion-free signal at an acceptable hardware cost. In general, equalizer design depends on the amount of intersymbol interference to be compensated, the modulation code, the data recovery technique to be used, the signal-to-noise ratio, and the noise spectrum shape.

A substantial portion of linear intersymbol interference when reading stored data in a magneto-optical recording system is caused by limited bandwidth of the analog read channel and roll-off of input signal amplitude with increased storage density. Accordingly, the equalization stage 206 may include one or more linear filters which modify the read channel transfer function so as to provide more reliable data detection. Normally, the equalization stage is implemented as part of the read channel, but, under certain conditions, part of the equalization filtering can be implemented as part of the write channel as well.

For purposes of analysis, the playback signal can be considered as a series of bipolar rectangular pulses having unit amplitude and a duration T. Alternatively, the playback signal may be considered as a series of bidirectional step functions at each flux reversal location, where the step amplitude matches the pulse amplitude. When an input signal is applied to the equalization stage 206, clocking information as well as pulse polarity for each clock cell or binit may be derived from the output signal of the equalization stage 206. The clocking and polarity information may be derived, in theory, by use of an ideal waveform restoration equalizer, which produces an output signal having mid-binit and binit boundary values similar to those of the input signal. The zero crossings of the output signal occur at binit boundaries in order to regenerate a clock accurately. If the zero-crossing time and direction are known, both clock and data can be extracted from the signal zero crossings.

In one embodiment, the equalization stage 206 includes an equalizer selected from a class of waveform restoration equalizers. Generally, a waveform restoration equalizer generates a signal including a binary sequence resembling the input or playback waveform. The corners of the otherwise rectangular pulses of the resultant signal are rounded because signal harmonics are attenuated in the channel. The resultant signal may also exhibit some output signal amplitude variation.

An equalizer which produces a minimum bandwidth output signal is an ideal low pass filter with response of unity to the minimum cutoff frequency and no response at higher frequencies. Although such an ideal low pass filter is not physically realizable, the Nyquist theorem on vestigial symmetry suggests that the sharp cutoff minimum bandwidth filter can be modified and still retain output pulse zero crossing at all mid-binit cell times. To achieve this result, the high frequency roll-off of the equalized channel is preferably symmetrical and locates the half-amplitude point at the minimum bandwidth filter cutoff frequency.

One type of roll-off characteristic that may be exhibited by a filter in the equalization stage 206 is a raised cosine roll-off, leading to the name raised cosine equalizer. A raised cosine roll-off transfer function is approximately realizable, and has an improved response over the minimum bandwidth filter. The output pulses have a zero value at times nT, but the sidelobe damped oscillation amplitude is reduced. The output zero crossings of the raised cosine filter are more consistent than those of the minimum bandwidth filter, and linear phase characteristics are more easily achieved with a gradual roll-off, such as with the relatively gradual roll-off of the raised cosine filter. These advantages, however, are typically obtained at the expense of increased bandwidth. The ratio of bandwidth extension to the minimum bandwidth, fm, is sometimes referred to as the "α" of the raised cosine channel. Thus, in the case of modulation code with d=0, α=0 is the minimum bandwidth but represents an unrealizable rectangular transfer function, while α=1 represents a filter using twice the minimum bandwidth.

The impulse transfer function of the raised cosine equalization channel (including the analog channel plus equalizer, but excluding the input filter) may be given as follows:

$H(f)=1$, for $0<f<(1-\alpha)*fm$ $H(f)=\frac{1}{2}\{1+cos[(f-(1-\alpha)*fm)/(2*\alpha*fm)]\}$, for $(1-\alpha)*fm<f<(1+\alpha)*fm$ $H(f)=0$ for $f>(1+\alpha)*fm$ where $\Phi(f)=k*f$ is the phase, and k is a constant. The above family may be referred to as α waveform restoration equalizers. The α=1 channel has the property of having nulls at half-binit intervals as well as at full binit intervals. Such a channel results in a signal having no intersymbol interference at mid-binit or binit boundary times, which are signal zero crossing and sample times, thus allowing accurate clock and data recovery. For such a full bandwidth equalizer, the roll-off starts at zero frequency and extends to the cutoff frequency $f_c$.

Raised cosine equalizers are capable of correcting extensive amounts of linear intersymbol interference given adequate signal-to-noise ratio. A large amount of high frequency boost is usually required to compensate for MO-media loss and optical short wavelength low resolution. An equalizer bandwidth equal to at least twice the minimum bandwidth is preferred for elimination of linear intersymbol interference, assuming a physically realizable channel operating on a modulation code with d=0. A bandwidth of such a width generally results in reduction of the signal-to-noise ratio. The equalizer bandwidth is selected to achieve the optimum compromise between interference, distortion and noise. In some instances, it may be desirable to narrow the bandwidth by using an α<1 transfer function in order to improve noise at the expense of added distortion in the form of clock jitter.

Another waveform-restoration equalizer is known as the cosine β response equalizer. The impulse transfer function of a full bandwidth β channel is as follows:

$H(f)=\cos^\beta(\pi*f/(2*f_c))$ for $0<f<f_c$ $H(f)=0$ for $f>f_c$

Like the α equalizer family, there are numerous β equalizers. Full bandwidth β equalizers have a cutoff frequency of $f_c$, and consequently reduce clock jitter due to the relatively small amount of interference at binit boundaries. Techniques are known in the art for optimizing these types of equalizing filters to achieve the minimum probability of error in various types of noise conditions.

Use of α equalizers generally results in a narrower bandwidth, thereby reducing noise at the expense of clock jitter or horizontal eye opening. Use of a β equalizer generally results in signal-to-noise ratio improvement by reducing high frequency boost without reducing the bandwidth. The choice of β equalizer may reduce the vertical eye opening or an effective amplitude reduction. The α=1 and β=2 equalizer channels are identical from the standpoint of eye pattern, both types of channels having a relatively wide open eye pattern.

A preferred equalizer channel bandwidth for codes with d>0 does not necessarily depend on the minimum recorded pulse width, Tr, as might be expected, but rather on the binit width, Tm. This is because the data-recovery circuits are generally required to distinguish between pulses that differ by as little as one binit width, and time resolution is a function of signal bandwidth. The (0,k) codes (where k represents the maximum number of contiguous binits without flux reversals) require a nominal bandwidth $BW_{NOM}=$ $1/Tm=f_c$ to eliminate interference at the center and edge of each binit, provided that intersymbol interference at binit boundaries is absent.

For codes with d>0, interference can be essentially eliminated at binit edges with a reduced bandwidth of $BW=1/(2*Tm)=f_c/2$. In such a case, all binit read pulses then have unit amplitude at a flux reversal, and the read-pulse tails cross zero at flux transitions. The narrower bandwidth BW results in output signal zero crossings at a point of no interference, without considering binit centers, but the bandwidth reduction is typically obtained with an increase in detection ambiguity in the presence of channel impairments. The narrower bandwidth BW may also result in a reduction of the signal zero-crossing slope, leading to a potential increase in detection sensitivity with respect to noise, disk speed variations, analog channel differences, or improper equalization. For example, a half-bandwidth β=2 equalization channel with a (1,k) ⅔ rate modulation code may result in a signal having no intersymbol interference at the signal zero crossings, but some amplitude variation between zero crossings. The bandwidth is less than the bandwidth for non-return to zero ("NRZI") modulation, even though more information is recorded than with NRZI modulation bandwidth=0.75 and bit rate=1.33 relative to NRZI). The reduced bandwidth makes up for the modulation code rate loss.

The α=1 and β waveform restoration equalizers may permit output zero crossings to occur at the equivalent of input pulse edges. Data detection can then be obtained by hard-limiting the equalized signal, generally resulting in an output signal resembling the original playback signal. However, this result occurs only if the equalizer response extends to DC, which is typically not the case for a magneto-optical channel. Low frequency loss in the MO channel causes drift up and down of the DC baseline, resulting in output binits which are lengthened or shortened according to the degree of amplitude offset at zero-crossing detector. This problem can be reduced by the use of either a DC-free modulation code or, preferably, DC restoration as described herein. In order to achieve the desired low frequency response for a waveform-restoration equalizer, the low frequency signals may have to be amplified significantly, which can seriously degrade signal-to-noise ratio under some conditions. If low frequency noise is present in significant amounts, waveform-restoration equalization techniques may not be very satisfactory unless a modulation code with no DC and little low-frequency content or DC restoration circuits are used.

Figure 6B:
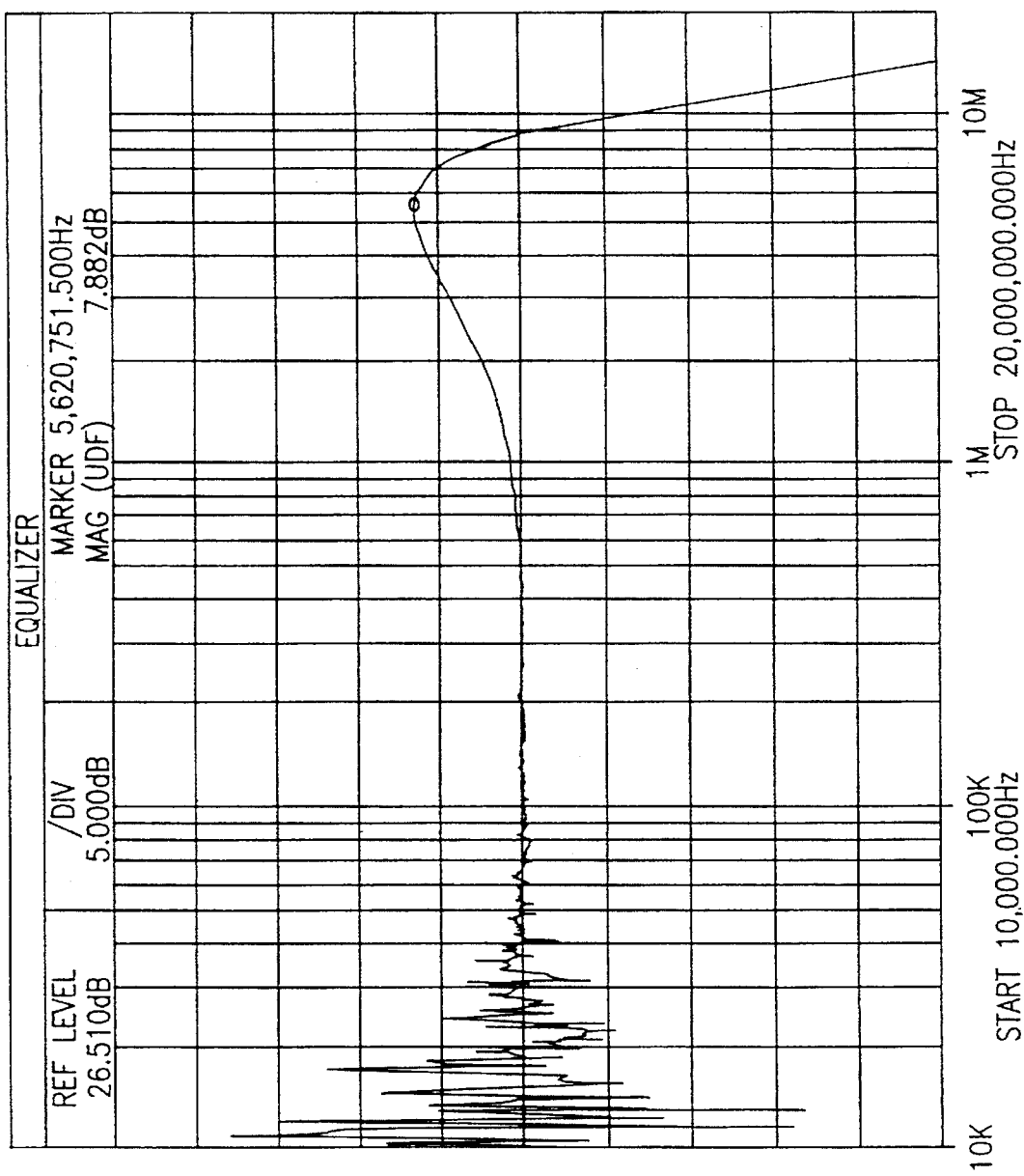

In a preferred embodiment, the equalization stage 206 may include a programmable filter and equalizer 207 located on an integrated chip. Such integrated chips are presently available from various manufacturers. The filter and equalizer 207 may be of an equi-ripple variety and have relatively constant group delay up to a frequency equal to about twice the cutoff frequency. A representative frequency response diagram of the equalization stage 204 is shown in FIG. 6B, and an exemplary output waveform is shown in FIG. 10C.

Figure 10C:
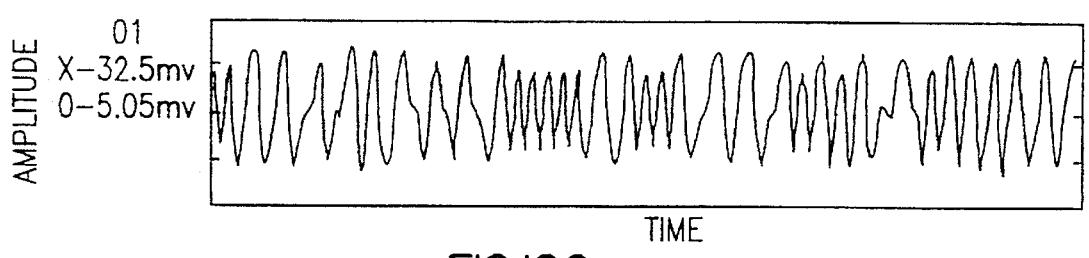

After the signal has been processed by the equalization stage 206, the signal peaks of the waveform in FIG. 10C contain accurate information regarding the position of the read data. The signal peaks can be detected by taking another derivative, but doing so may be detrimental to the system's signal-to-noise ratio and will likely cause undesired jitter. A preferred embodiment of the invention described herein provides an accurate means for detecting the signal peaks without taking a second derivative, by using partial integration and a novel data generation circuit.

Figure 6C:
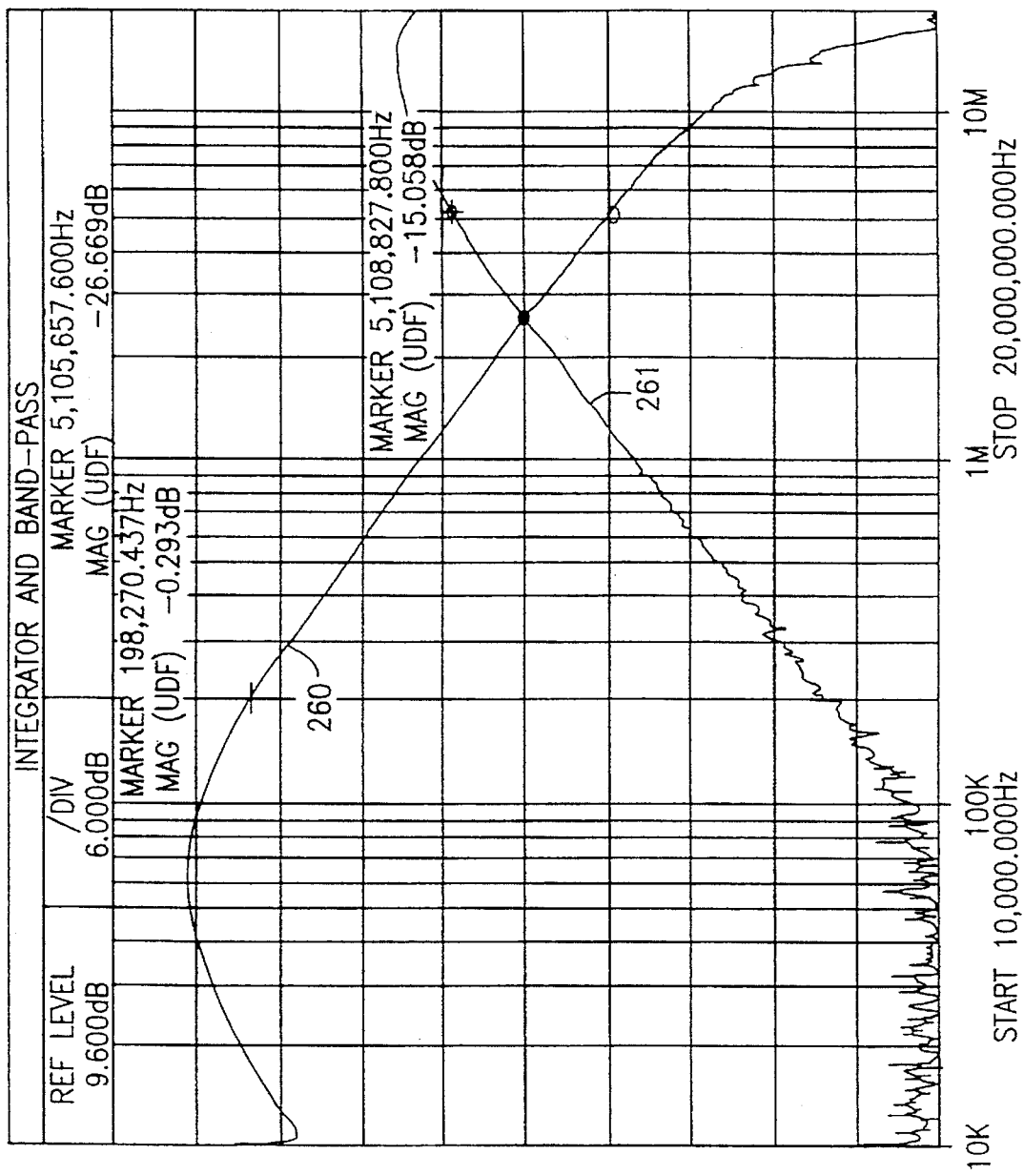

After the signal has been processed by the equalization stage 206, it is provided to the partial integrator stage 208 for further shaping of the waveform. As illustrated in FIG. 5, the partial integrator stage 208 may include an amplifier stage 229, a bandpass filter stage 230, an integrator and low pass filter stage 232, and a subtractor and low pass filter stage 234. The amplifier stage 229 receives the output of the equalization stage 206 and provides a signal to the bandpass filter stage 230 and the integrator and low pass filter stage 232. The integrator and low pass filter stage 232 preferably attenuates a selected range of high frequency components. A representative frequency response 260 of the integrator and low pass filter stage 232 and a representative frequency response 261 of the bandpass filter stage 230 are depicted in FIG. 6C.

Figure 6D:
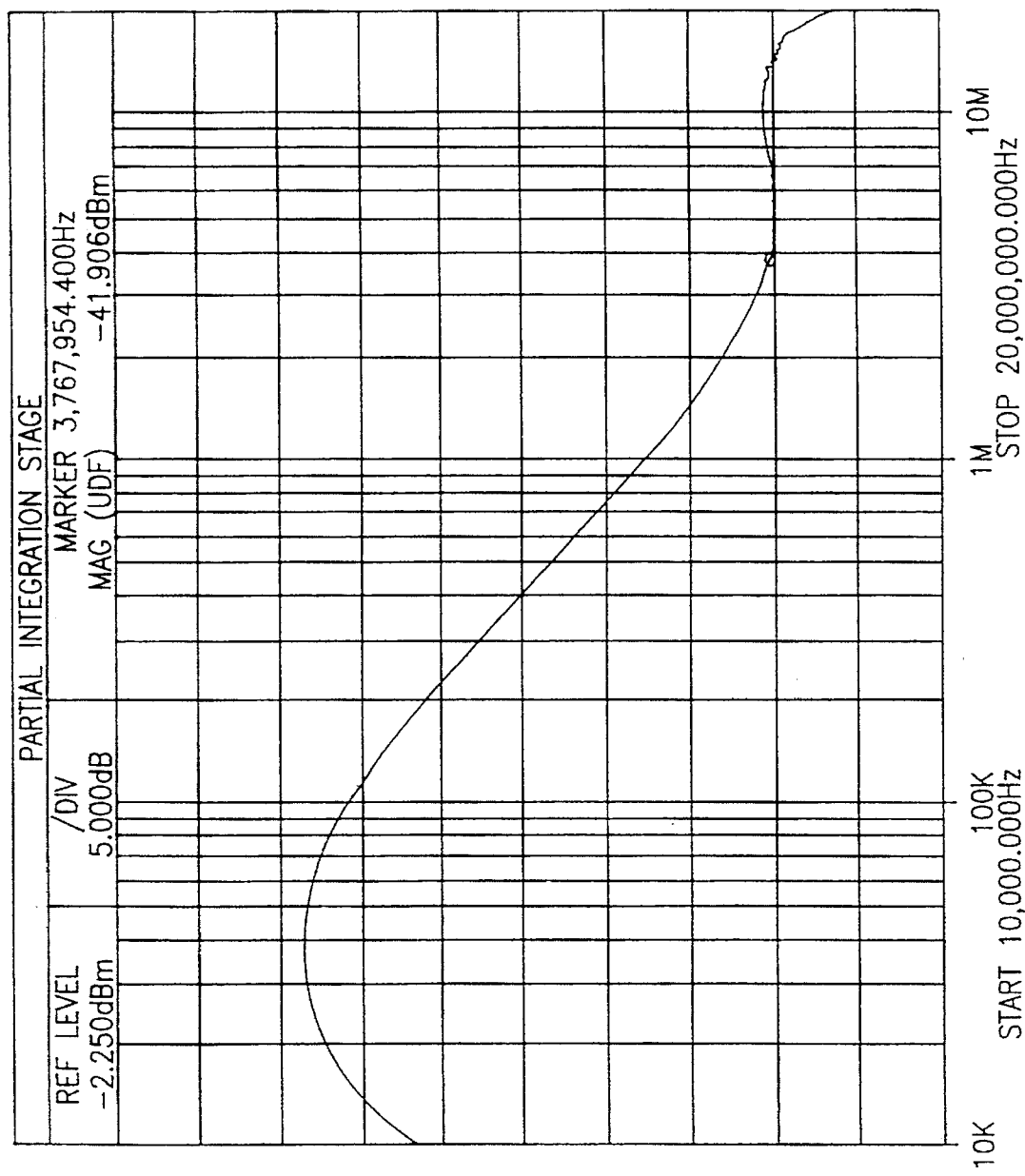
Figure 10D:
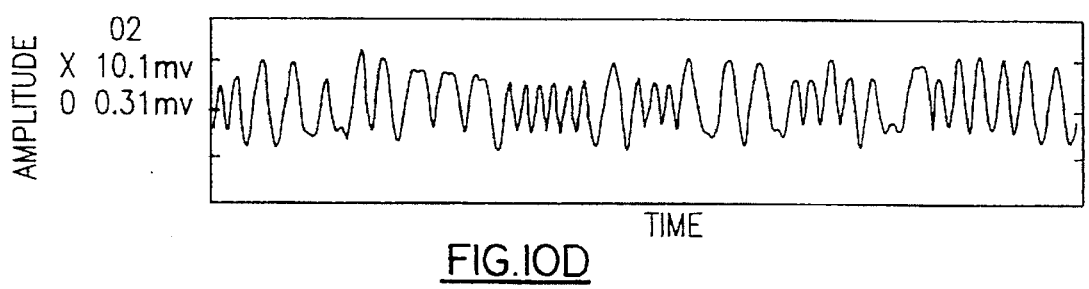
Figure 5:
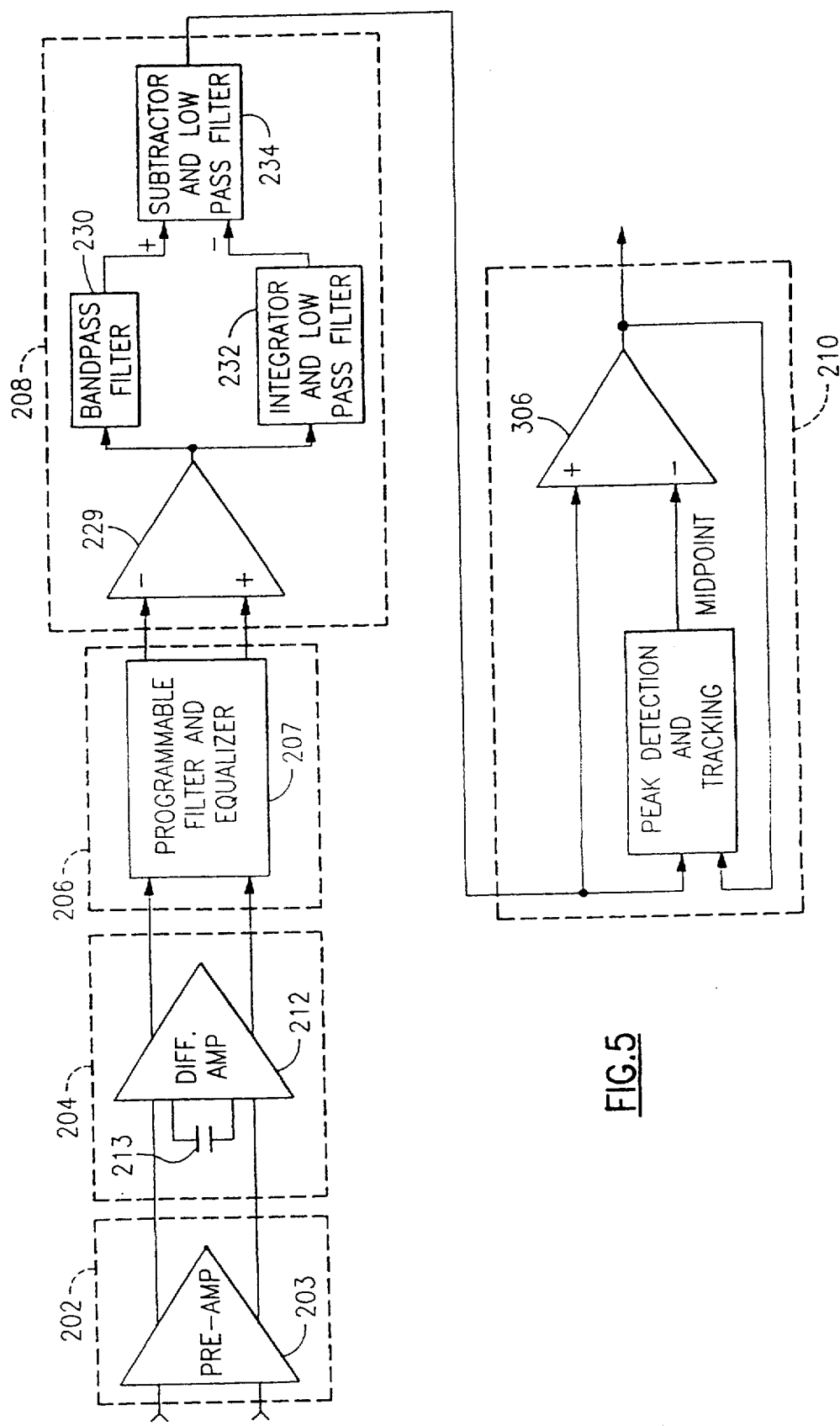
Figure 7:
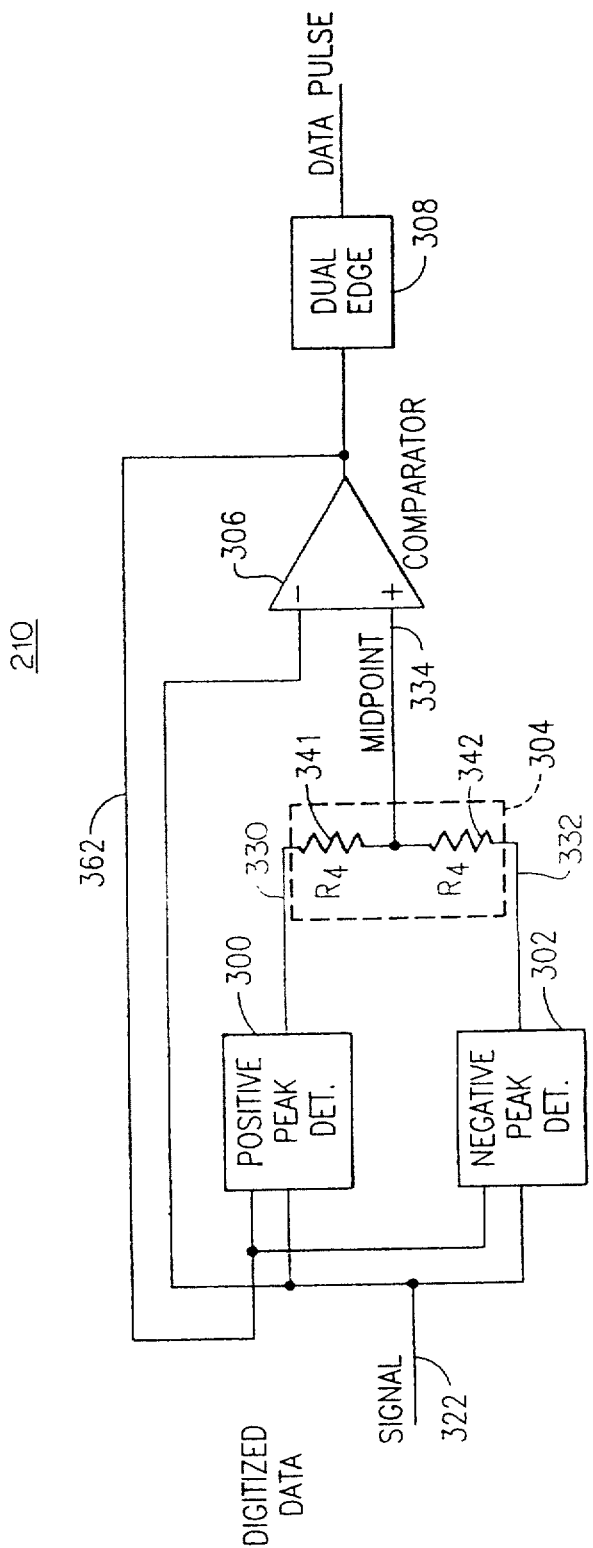
Figure 8:
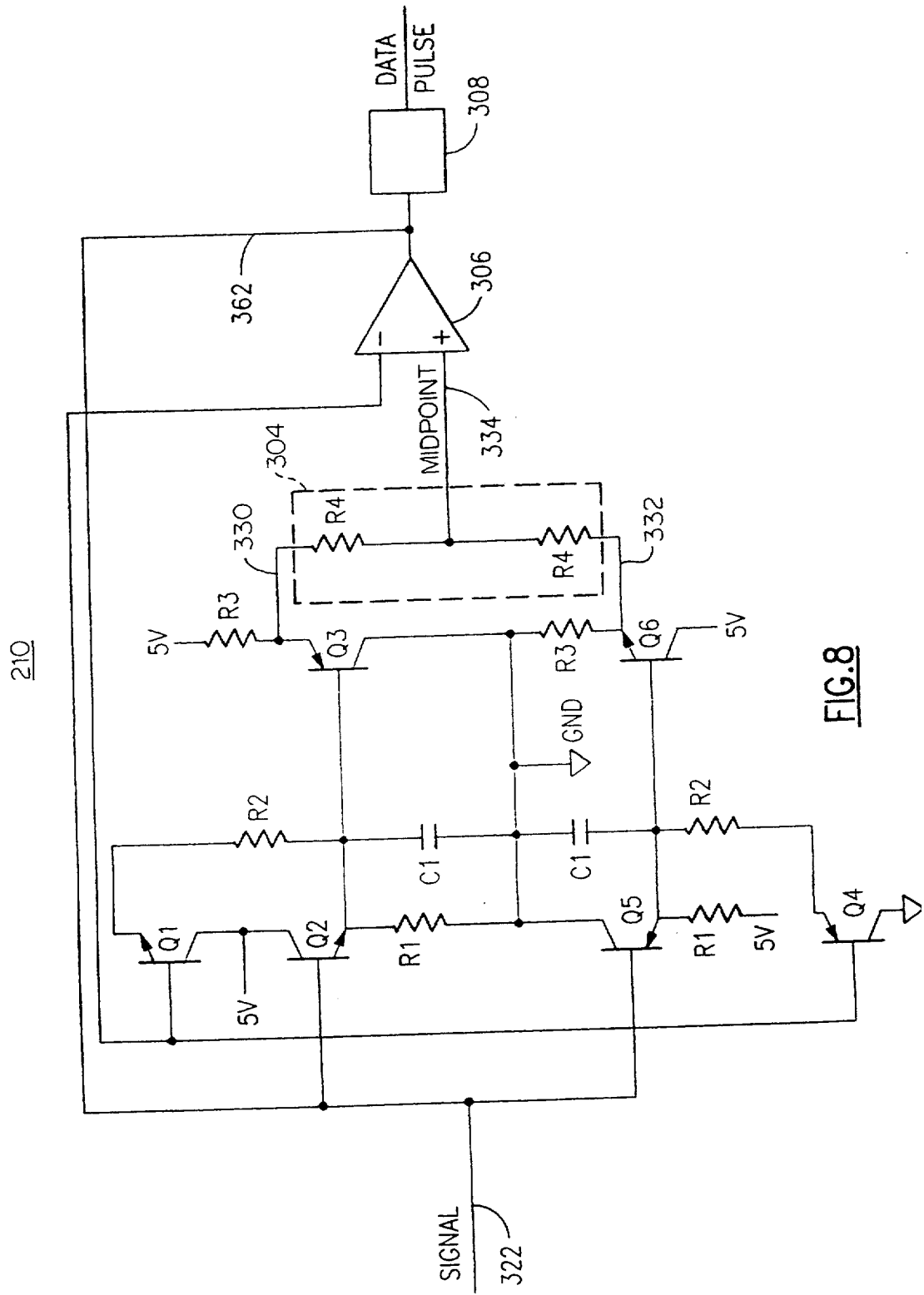

The output of the bandpass filter stage 230 is thereafter subtracted from the output of the integrator and low pass filter stage 232 and filtered by the low pass filter stage 234. A graph of the total frequency response of the partial integrator stage 208, including the low pass filter 234, is shown in FIG. 6D. An exemplary output waveform of the partial integrator stage 208 is shown in FIG. 10D.

A detailed circuit diagram of a particular embodiment of a partial integrator stage is illustrated in FIG. 5B. In FIG. 5B, a differential input 238, 239 is received, such as from the equalization stage 206. The differential input 238, 239 is provided to differential amplifier 240, configured as shown, which differentially sums its inputs. Differential amplifier 240 essentially corresponds to amplifier stage 229 shown in FIG. 5.

An output 249 from the differential amplifier 240 is connected to a pair of current generators 241 and 242. The first current generator 241 includes a resistor R77 and a PNP transistor Q61, configured as shown in FIG. 5B. The second current generator 242 also includes a resistor R78 and a PNP transistor Q11, configured as shown in FIG. 5B.

An output from current generator 241 is connected to a bandpass filter 243. The bandpass filter 243 includes an inductor L3, a capacitor C72 and a resistor R10, configured in parallel as shown in FIG. 5B. The bandpass filter 243 essentially corresponds to bandpass filter stage 230 of FIG. 5. An output from the other current generator 242 is connected to an integrator 244. The integrator 244 includes a capacitor C81 and a resistor R66, configured in parallel as shown in FIG. 5B.

An output from the integrator 244 is connected through a resistor R55 to a NPN transistor Q31. Transistor Q31 is configured as an emitter-follower, providing isolation with respect to the output of the integrator 244, and acting as a voltage source. The emitter of transistor Q31 is connected to a low pass filter 245. The low pass filter 245 includes an inductor L6, a capacitor C66 and a resistor R49, configured as shown in FIG. 5B. The integrator 244, emitter-follower including transistor Q31, and low pass filter 245 essentially correspond to the integrator and low pass filter stage 232 shown in FIG. 5. The frequency response of the integrator 244 essentially corresponds to the frequency response 260 shown in FIG. 6C, while the frequency response of the low pass filter 245 essentially corresponds to the frequency response 261 shown in FIG. 6C.

An output from the low pass filter 245 and an output from the bandpass filter 243 are coupled to a differential amplifier 246, configured as shown in FIG. 5B. Differential amplifier 246 differentially sums its inputs, and provides a differential output to another low pass filter 247. The differential amplifier 246 and low pass filter 247 correspond essentially to the subtractor and low pass filter stage 234 shown in FIG. 5.

Exemplary waveforms for the circuit of FIG. 5B are shown in FIG. 6G. FIG. 6G shows first an exemplary input waveform 256 as may be provided to differential amplifier 240 from, e.g., equalizer 206. The next waveform 257 in FIG. 6G corresponds to an output from the bandpass filter 243 in response to the FIG. 5B circuit receiving input waveform 256. The next waveform 258 in FIG. 6G corresponds to an output from the low pass filter 245 in response to the FIG. 5B circuit receiving input waveform 256. Waveform 258 shows the effect of operation of the integrator 244. The function of low pass filter 245 is essentially to provide a delay to align the output of the bandpass filter 243 and the integrator 244 in time at the input of differential amplifier 246. Low pass filter 245 thereby matches the delays along each input leg of the differential amplifier 246 prior to differential summing.

The final waveform 259 in FIG. 6G corresponds to an output from the second low pass filter 247, after the signals output from the bandpass filter 243 and low pass filter 245 have been combined and filtered. Waveform 259 typically exhibits considerably improved resolution over the original playback signal read from the magnetic medium.

It should be noted that the partial integration functions described with respect to FIGS. 5 and 5B are carried out using differential amplifiers (e.g., differential amplifiers 240 and 246), thereby providing common mode rejection or, equivalently, rejection of the DC component of the input signal 238, 239. Another feature of the embodiments shown in FIGS. 5 and 5B is the relatively favorable frequency response characteristics exhibited by the partial integration stage. In particular, by combining an integrated signal with a high pass filtered signal (e.g., at subtractor and low pass filter block 214 or differential amplifier 246), noise is removed from the differentiated and equalized playback signal, but while maintaining relatively rapid response time due in part to the high pass frequency boost provided by the bandpass filter.

Figure 6E:
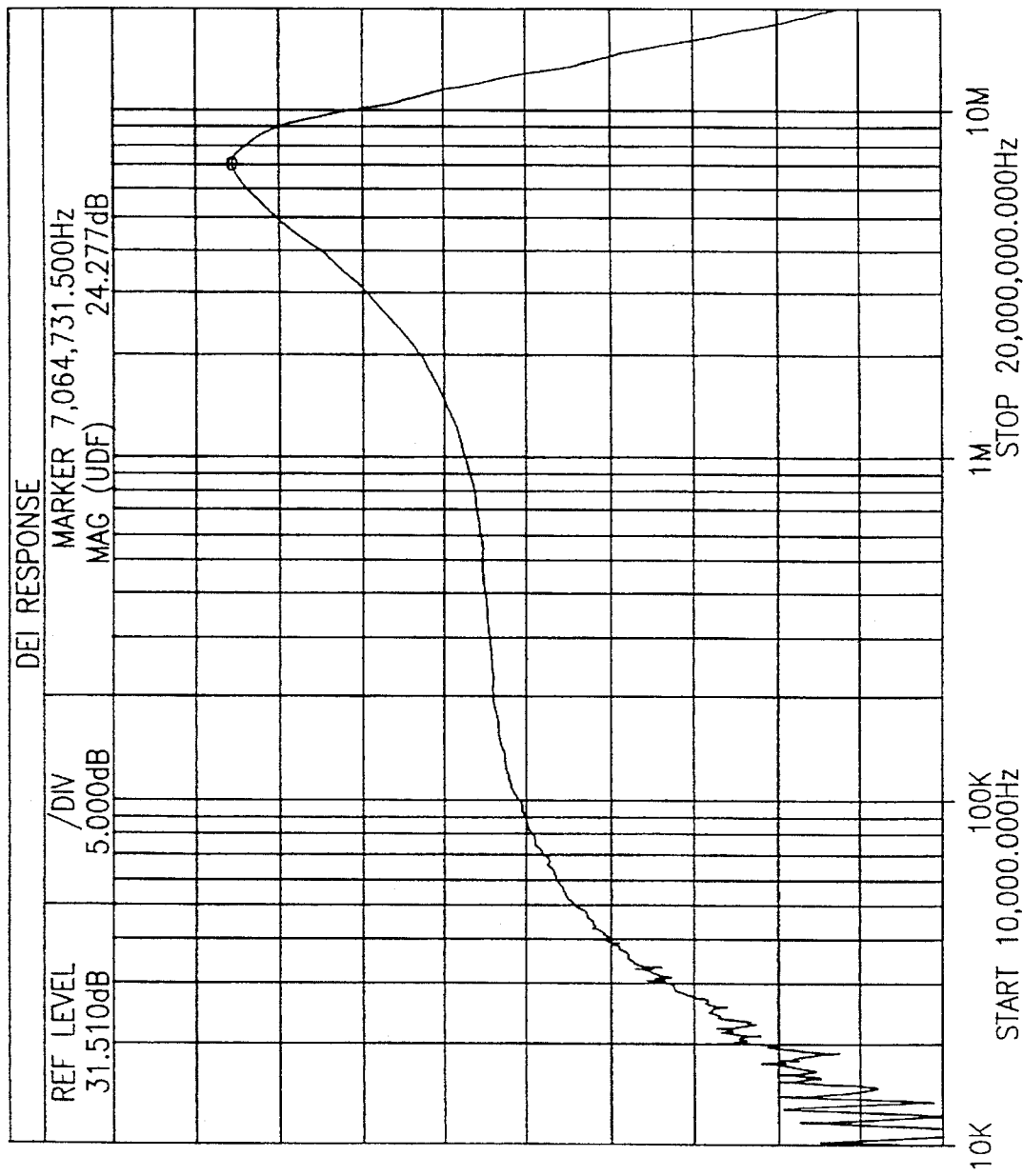
Figure 6F:
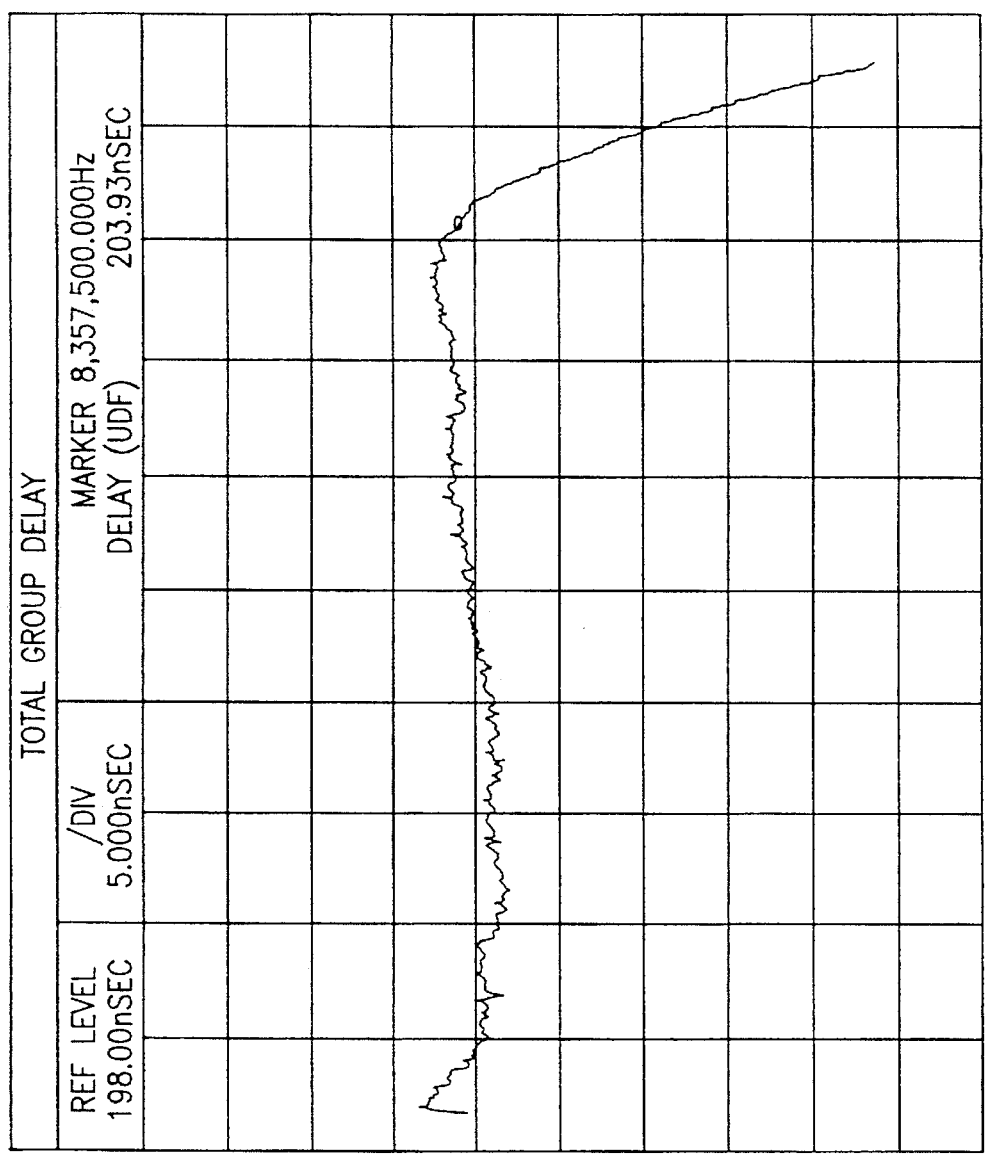
FIG. 6F is a plot of group delay for a combination of stages in a read channel.

A primary function of the combination of the differentiation stage 204, the equalization stage 206, and the partial integration stage 208 is to shape the playback signal 220 in an appropriate manner for facilitating data recovery. As can be seen by comparing FIGS. 10A and 10D, the resultant signal shown in FIG. 10D is similar to the playback signal 220 of FIG. 10A (from which it was derived) but differs therefrom in that the amplitudes of its high and low frequency components have been equalized and sharp noise-like characteristics removed. A graph of the total frequency response for the combination of the differentiation stage 204, the equalization stage 206, and the partial integration stage 208 is shown in FIG. 6E. A graph of the total group delay response for the same chain of elements is shown in FIG. 6F.

It may be noted that tape drive systems presently exist utilizing equalization and integration of a playback signal in order to facilitate data recovery. However, to a large degree such systems do not suffer from the problems of DC buildup because they typically utilize DC-free codes. As mentioned previously, DC-free codes have the disadvantage of being relatively low in density ratio and hence inefficient. The present invention in various embodiments allows for the use of more efficient coding systems by providing means for eliminating the effects of DC buildup without necessarily using a DC-free code.

Figure 9:
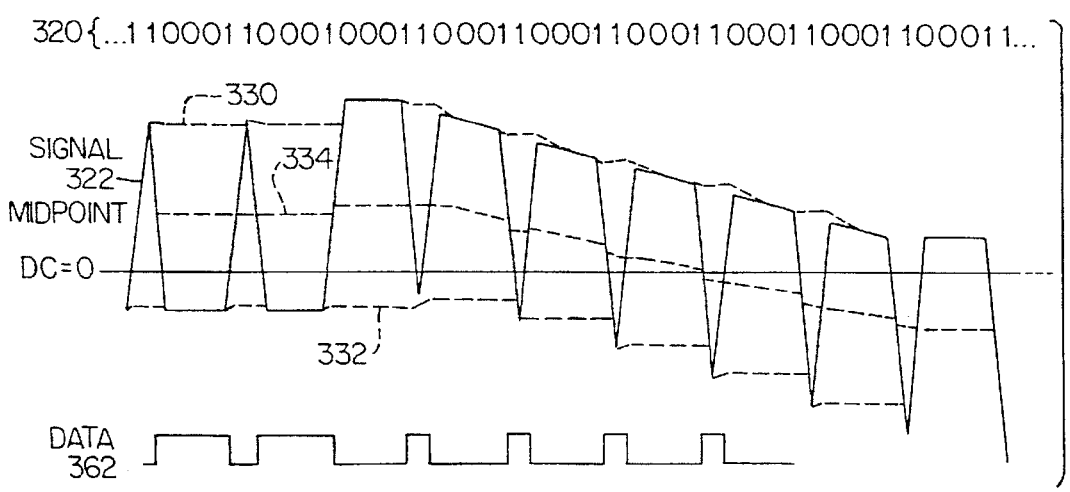
FIG. 9 is a waveform diagram showing tracking by a threshold signal of the DC envelope of an input signal.
Figure 7:
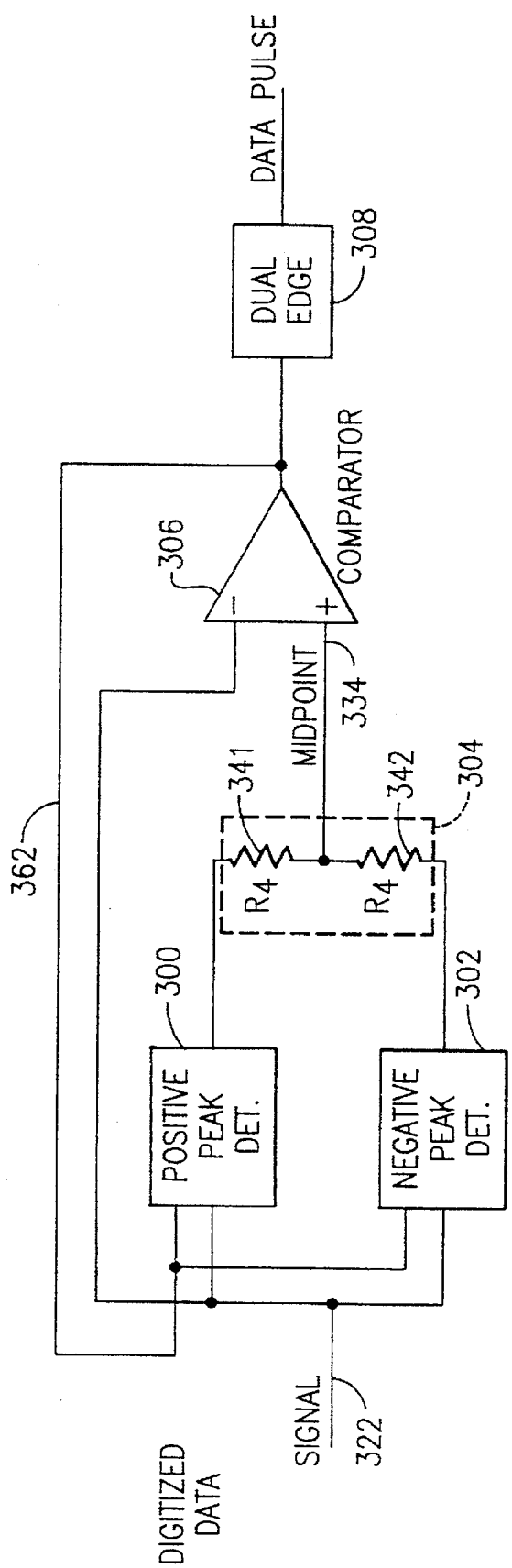
FIG. 7 is a block diagram of a peak detection and tracking circuit.

The output of the partial integrator stage 208 (e.g., the waveform in FIG. 10D) is provided to the data generation stage 210. A block diagram of the data generation stage 210 is shown in FIG. 7. The data generation stage 210 includes a positive peak detector 300, a negative peak detector 302, a voltage divider 304, a comparator 306, and a dual edge circuit 308. The operation of the circuit shown in FIG. 7 may be explained with reference to FIG. 9. In FIG. 9, it is assumed that a recorded bit sequence 320 has been read and eventually caused to be generated, in the manner as previously described, a preprocessed signal 322 from the partial integrator stage 208. It should be noted that the preprocessed signal 322 and various other waveforms described herein have been idealized somewhat for purposes of illustration, and those skilled in the art will appreciate that the actual waveforms may vary in shape and size from those depicted in FIG. 9 and elsewhere.

The preprocessed signal 322 is fed to the positive peak detector 300 and the negative peak detector 302 which measure and track the positive and negative peaks, respectively, of the preprocessed signal 322. The positive peak output signal 330 of the positive peak detector 300 and the negative peak output signal 332 of the negative peak detector 302 are depicted in FIG. 9. The positive peak output signal 330 and the negative peak output signal 332 are averaged by the voltage divider 304, which is comprised of a pair of resistors 341 and 342. The output of voltage divider 304 is utilized as a threshold signal 334 and represents the approximate peak-to-peak midpoint of the preprocessed signal 332. The output of the voltage divider 304 is provided to the comparator 306 which compares the divided voltage with the preprocessed signal 332. The comparator 306 changes states when the preprocessed signal 332 crosses the threshold signal 334, indicating a transition in the read data from a 1 to 0 or a 0 to 1. The output of comparator 306 is shown as output data waveform 362 in FIG. 9. As explained in more detail below, the output data waveform 362 is fed back to the positive peak detector 300 and negative peak detector 302 to allow tracking of the DC envelope. The output of the comparator 306 is also provided to the dual edge circuit 308 which generates a unipolar pulse of fixed duration each time the comparator 306 changes states.

The output of the dual edge circuit 308 provides clocking and data information from which recovery of the recorded data may be had in a straightforward manner. For example, in a pulse-width modulation ("PWM") technique such as the GCR 8/9 modulation code described previously, each data pulse output from the dual edge circuit 308 represents a transition in flux (i.e., a recorded 1-bit), while the lack of data pulse at clock intervals would represent the lack of transition in flux (i.e., a recorded 0-bit). The sequence of recorded bits can thereafter be decoded by decoder 24 (shown in FIG. 1) by methods well known in the art to determine the original data.

Figure 8:
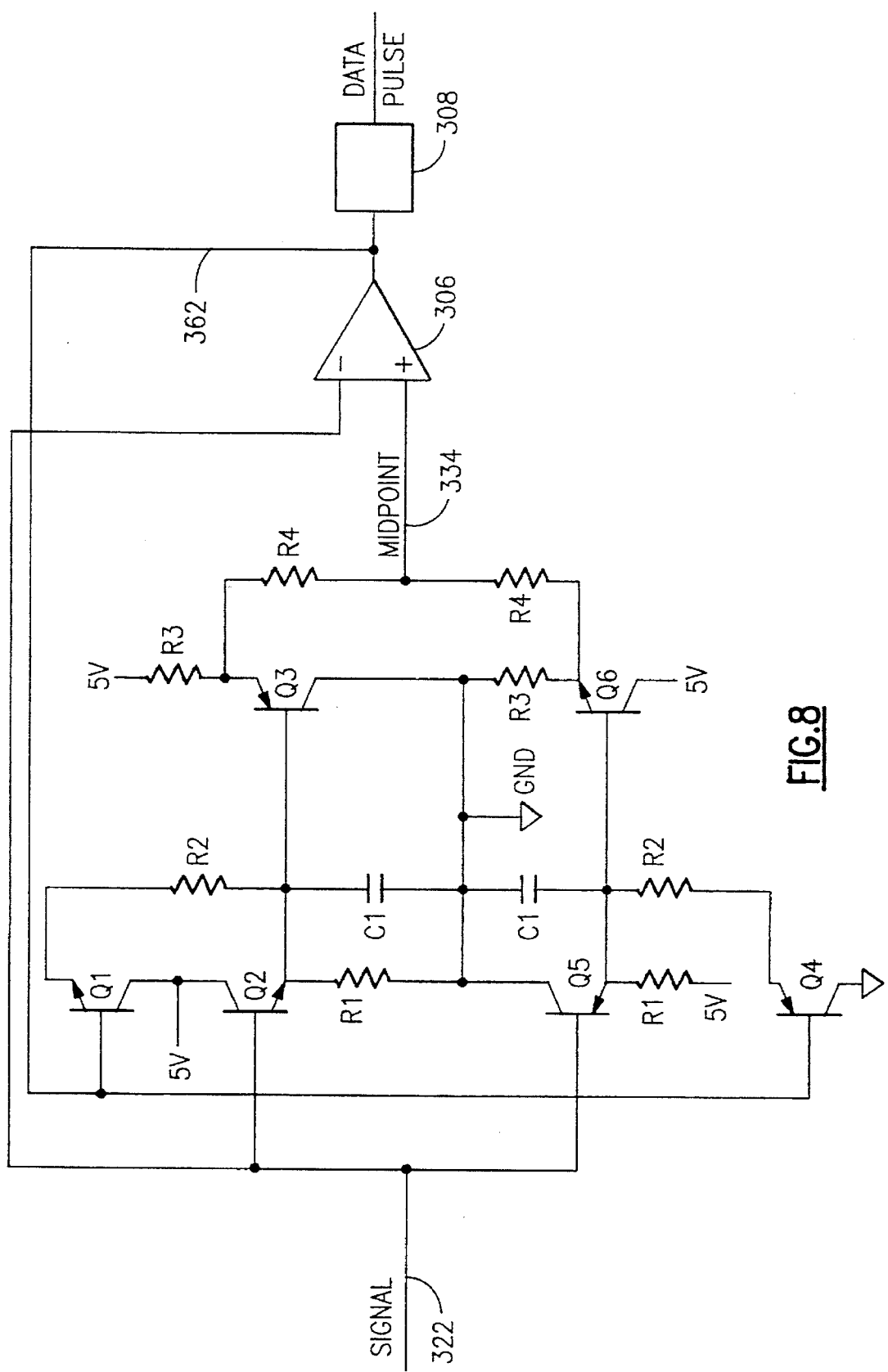
FIG. 8 is a schematic diagram of the peak detection and tracking circuit of FIG. 7.

In order to properly track the envelope caused by the DC portion of the preprocessed signal 322, a preferred embodiment feeds back duty cycle information from the output signal 362 to the peak detectors. Thus, the output of the comparator 306 is fed back to the positive peak detector 300 and the negative peak detector 302. This process may be explained further by reference to FIG. 8 which depicts a more detailed circuit diagram of the data generator stage 210. As shown in FIG. 8, the preprocessed signal 322 is provided to the base of transistors Q2 and Q5. Transistor Q2 is associated with the positive peak detector 300, and transistor Q5 is associated with the negative peak detector 302. Because the positive peak detector 300 and negative peak detector 302 operate in an analogous fashion, the duty cycle feedback operation will be explained only with reference to the positive peak detector 300, while those skilled in the art will understand by perusal of FIG. 8 and the description below the analogous operation of negative peak detector 302.

Transistor Q2 charges a capacitor C1 when the amplitude of the preprocessed signal 322 exceeds the stored voltage of the capacitor C1 (plus the forward bias voltage of the transistor Q2). In FIG. 9, it can be seen that the positive peak output signal 330 charges rapidly to the peak of the signal 332. The output signal 362, through feedback, maintains the positive charge on the capacitor C1 when the output signal 362 is high and allows the capacitor C1 to discharge when the output signal 362 is low. Thus, if the output signal 362 is high, the positive charge on capacitor C1 is maintained by transistor Q1 through resistor R2. Preferably, resistors. R1 and R2 are selected to be the same value so that charge is added to the capacitor through resistor R2 at the same rate that it is discharged through resistor R1, thus maintaining as constant the net charge on capacitor C1. If, on the other hand, the output signal 362 is low, then transistor Q1 is turned off and capacitor C1 is allowed to discharge though resistor R1. The values of capacitor C1 and resistor R1 are preferably selected such that the time constant is slightly faster than the speed of expected DC buildup so that the capacitor C1 can track the change in DC level as it occurs.

The output of capacitor C1 is provided to the base of transistor Q3. The voltage level of the emitter of Q3 is a bias voltage level above the output of capacitor C1. Current is drawn through resistor R3 which allows the emitter of transistor Q3 to follow the voltage of the capacitor C1 (offset by the emitter-base bias voltage). Thus, the emitter of transistor Q3 yields positive peak output signal 330. It should be noted that transistors Q1 and Q2 are NPN type transistors while Q3 is a PNP type resistor. Thus, the NPN-PNP configuration largely cancels out adverse thermal effects that may be experienced with transistors Q1, Q2 and Q3 and also cancels out the bias voltages associated with their operation.

The negative peak detector 302 operates in an analogous fashion to the positive peak detector 300 and is therefore not explained in greater detail. The emitter of transistor Q6 yields negative peak output signal 332.

As described previously, positive peak output signal 330 and negative peak output signal 332 are averaged by the voltage divider 304 comprised of pair of resistors R4 as shown in FIG. 8 to form threshold signal 334. The threshold signal 334 therefore constitutes the approximate midpoint of the peak-to-peak value of the preprocessed signal 322 tracks the DC envelope of the preprocessed signal 322 through duty cycle feedback compensation.

Although the duty cycle feedback has been shown in the preferred embodiment as originating from the output of the comparator 306, it may be observed that other feedback paths may also be utilized. For example, a similar feedback path may be taken from the output of dual edge circuit 308 if a flip/flop or other memory element is placed at the output of the dual edge circuit 308. Also, other means for measuring duty cycle and adjusting the threshold signal to track the DC envelope may be utilized.

A preferred technique such as described generally in FIGS. 4 and 5 includes the step of differentiation of the playback signal prior to partial integration, followed thereafter by the step of DC tracking. The preferred method is particularly suitable for systems having a playback signal with relatively poor resolution, and may be advantageously applied, for example, to reading information stored in a GCR format. In one aspect of the preferred method, the initial step of differentiation reduces the low frequency component from the incoming playback signal. In another aspect of the preferred method, the partial integration stage results in restoration or partial restoration of the playback signal while providing rapid response due to the high pass boost (e.g., from the bandpass filter stage). The preferred method may be contrasted with a method in which integration of the playback signal is carried out initially (i.e., prior to differentiation), which may lead to an increased size of DC component and a correspondingly more difficult time in tracking the DC component.

It will be appreciated that the various circuits and methods described herein are not limited to magneto-optical systems but may also be useful in systems for reading data on stored tapes and other types of disks as well and, in a more general sense, in any system (whether or not a data storage system) for processing electrical signals in which it is desired to mitigate the effects of DC buildup.

While this invention has been described in detail with reference to certain preferred embodiments, it should be appreciated that the present invention is not limited to those precise embodiments. Rather, in view of the present disclosure which describes the current best mode for practicing the invention, many modifications and variations would present themselves to those of skill in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

What is claim is:

1. A method for detecting transitions in an input signal having a DC component, said method comprising the steps of:

generating a threshold signal from said input signal;
comparing said input signal to said threshold signal; and
adjusting said threshold signal in response to said output signal.

2. The method according to claim 1 wherein said step of adjusting said threshold signal in response to said output signal causes said threshold signal to track the DC component of said input signal.

3. The method according to claim 1 wherein, said input signal includes peaks corresponding to locations of data stored on a medium.

4. The method according to claim 3 wherein said step of generating a threshold signal includes detecting respective voltage levels of said peaks.

5. The method according to claim 1 wherein an amount of adjustment to said threshold signal in response to said output signal is proportional to a duty cycle of said output signal.

6. A method for retrieving data stored on a medium, said method comprising the steps of:

reading said stored data to thereby generate a playback signal;

partially integrating said playback signal;

generating a threshold signal which varies with a DC component of said partially integrated signal; and generating an output signal indicative of said stored data by comparing said partially integrated signal with said threshold signal.

7. The method according to claim 6 wherein said medium includes a magneto-optical disk.

8. The method according to claim 6 further comprising the step of differentiating said playback signal prior to said partially integrating step.

9. The method according to claim 6 wherein said step of partially integrating comprises:

integrating said playback signal;

simultaneously with but separately from said integrating, bandpass filtering said playback signal; and taking a difference between said integrated signal and said bandpass filtered signal to thereby generate a difference signal.

10. The method according to claim 9 further comprising the step of low pass filtering said difference signal.

11. The method according to claim 6 wherein said step of generating a threshold signal comprises:

detecting a positive peak voltage of said partially integrated signal;

detecting a negative peak voltage of said partially integrated signal; and averaging said positive peak voltage and said negative peak voltage.

12. The method according to claim 11 further comprising the step of adjusting said threshold signal in response to a state of said output signal.

13. The method according to claim 12 wherein said threshold signal is adjusted by decreasing a detected positive peak voltage when said output signal is in one of either a low state or high State, and decreasing a detected negative peak voltage when said output signal is in the other of said low state or high state.

14. The method according to claim 6 wherein said threshold signal corresponds to an approximate midpoint of said partially integrated signal.

15. A method for retrieving data stored on a medium, said method comprising the steps of:

reading the stored data to thereby generate a signal;

partially integrating said signal;

generating a threshold signal corresponding to an approximate midpoint of said partially integrated signal; and generating an output signal indicative of said stored data by comparing said partially integrated signal with said threshold signal.

16. The method according to claim 15 wherein said medium includes a magneto-optical disk.

17. The method according to claim 15 wherein said step of reading said stored data includes the steps of generating an input signal and differentiating said input signal.

18. The method according to claim 15 wherein said step of partially integrating said signal comprises:

integrating said signal;

simultaneously but separately with said integrating, bandpass filtering said signal; and taking a difference between said integrated signal and said bandpass filtered signal.

19. The method according to claim 15 wherein said step of generating a threshold signal includes adjusting said threshold signal in response to said output signal.

20. The method according to claim 19 wherein the adjustment to said threshold signal is proportional to a duty cycle of said output signal.

* * * * *

UNITED STATES PATENT AND TRADEMARK OFFICE
CERTIFICATE OF CORRECTION

PATENT NO. : 5,659,535
DATED : August 19, 1997
INVENTOR(S) : Noboro KIMURA, et al It is certified that error appears in the above-identified patent and that said Letters Patent is hereby corrected as shown below:

In the Drawings:

Delete Drawings Sheets 5, 15, and 16, and substitute therefor the Drawing Sheets, consisting of Figs. 5, 7, and 8, as shown on the attached pages.

Signed and Sealed this

Fourteenth Day of April, 1998

*Attest:*

BRUCE LEHMAN

*Attesting Officer*  Commissioner of Patents and Trademarks

UNITED STATES PATENT AND TRADEMARK OFFICE
CERTIFICATE OF CORRECTION

PATENT NO. : 5,659,535
DATED : August 19, 1997
INVENTOR(S) : Noboru Kimura, et. al.

It is certified that error appears in the above-identified patent and that said Letters Patent is hereby corrected as shown below:

Column 2, line 38, delete the word "unsymmetric" and insert --asymmetric--.
Column 2, line 49, delete the word "unsymmetric" and insert --asymmetric--.
Column 3, line 66, delete the word "asymmetric' and insert --a symmetric--.
Column 6, line 23, delete "$M_1$" and insert --$M_{p1}$--.
Column 14, line 61 delete "; and" and insert --to thereby generate an output signal; and--.

Column 16, line 7, delete the second occurrence of "State," and insert --state--.

Signed and Sealed this

Twenty-fourth Day of August, 1999

Attest:

Q. TODD DICKINSON

*Attesting Officer*  *Acting Commissioner of Patents and Trademarks*